United States Patent
Waller et al.

(10) Patent No.: US 7,486,563 B2
(45) Date of Patent: *Feb. 3, 2009

(54) SENSE AMPLIFIER CIRCUITRY AND ARCHITECTURE TO WRITE DATA INTO AND/OR READ FROM MEMORY CELLS

(75) Inventors: William Kenneth Waller, Eagle, ID (US); Eric Carman, Cernex (FR)

(73) Assignee: Innovative Silicon ISi SA, Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 11/982,807

(22) Filed: Nov. 5, 2007

(65) Prior Publication Data

US 2008/0062793 A1 Mar. 13, 2008

Related U.S. Application Data

(62) Division of application No. 11/299,590, filed on Dec. 12, 2005, now Pat. No. 7,301,838.

(60) Provisional application No. 60/635,709, filed on Dec. 13, 2004.

(51) Int. Cl.
 *G11C 16/06* (2006.01)
(52) U.S. Cl. .................. 365/185.21; 365/196; 365/207; 365/189.09; 365/205
(58) Field of Classification Search ................ 365/205, 365/185.21, 196, 207, 189.09, 154, 210.14
See application file for complete search history.

(56) References Cited

U.S. PATENT DOCUMENTS 3,439,214 A 4/1969 Kabell (Continued)

FOREIGN PATENT DOCUMENTS

EP 0 030 856 6/1981

(Continued)

OTHER PUBLICATIONS

"Design of a SOI Memory Cell", Stanojevic et al., IEEE Proc. 21$^{st}$ International Conference on Microelectronics (MIEL '97), vol. 1, NIS, Yugoslavis, Sep. 14-17, 1997, pp. 297-300.

(Continued)

*Primary Examiner*—Thong Q Le
(74) *Attorney, Agent, or Firm*—Neil A. Steinberg

(57) ABSTRACT

A technique of, and circuitry for sampling, sensing, reading and/or determining the data state of a memory cell of a memory cell array (for example, a memory cell array having a plurality of memory cells which consist of an electrically floating body transistor). In one embodiment, sense amplifier circuitry is relatively compact and pitched to the array of memory cells such that a row of data may be read, sampled and/or sensed during a read operation. In this regard, an entire row of memory cells may be accessed and read during one operation which, relative to at least architecture employing multiplexer circuitry, may minimize, enhance and/or improve read latency and read access time, memory cell disturbance and/or simplify the control of the sense amplifier circuitry and access thereof. The sense amplifier circuitry may include write back circuitry to modify or "re-store" the data read, sampled and/or sensed during a read operation and/or a refresh operation in the context of a DRAM array. Moreover, the data that has been read, sampled and/or sensed by the sense amplifier circuitry during a read operation may be modified before being written back to one or more of the memory cells of the selected row of the array of memory cells.

25 Claims, 31 Drawing Sheets

U.S. PATENT DOCUMENTS

| | | | |
|---|---|---|---|
| 3,997,799 | A | 12/1976 | Baker |
| 4,032,947 | A | 6/1977 | Kesel et al. |
| 4,250,569 | A | 2/1981 | Sasaki et al. |
| 4,262,340 | A | 4/1981 | Sasaki et al. |
| 4,298,962 | A | 11/1981 | Hamano et al. |
| 4,371,955 | A | 2/1983 | Sasaki |
| 4,527,181 | A | 7/1985 | Sasaki |
| 4,630,089 | A | 12/1986 | Sasaki et al. |
| 4,791,610 | A | 12/1988 | Takemae |
| 4,979,014 | A | 12/1990 | Hieda et al. |
| 5,144,390 | A | 9/1992 | Matloubian |
| 5,258,635 | A | 11/1993 | Nitayama et al. |
| 5,319,755 | A | 6/1994 | Farmwald et al. |
| 5,388,068 | A | 2/1995 | Ghoshal et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,528,062 | A | 6/1996 | Hsieh et al. |
| 5,568,356 | A | 10/1996 | Schwartz |
| 5,593,912 | A | 1/1997 | Rajeevakumar |
| 5,606,188 | A | 2/1997 | Bronner et al. |
| 5,627,092 | A | 5/1997 | Alsmeier et al. |
| 5,631,186 | A | 5/1997 | Park et al. |
| 5,696,718 | A | 12/1997 | Hartmann |
| 5,740,099 | A | 4/1998 | Tanigawa |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,811,283 | A | 9/1998 | Sun |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,929,479 | A | 7/1999 | Oyama |
| 5,930,648 | A | 7/1999 | Yang |
| 5,936,265 | A | 8/1999 | Koga |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,968,840 | A | 10/1999 | Park et al. |
| 5,977,578 | A | 11/1999 | Tang |
| 5,982,003 | A | 11/1999 | Hu et al. |
| 6,018,172 | A | 1/2000 | Hidaka et al. |
| 6,081,443 | A | 6/2000 | Morishita |
| 6,096,598 | A | 8/2000 | Furukawa et al. |
| 6,097,056 | A | 8/2000 | Hsu et al. |
| 6,111,778 | A | 8/2000 | MacDonald et al. |
| 6,121,077 | A | 9/2000 | Hu et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,708 | B1 | 1/2001 | Kuang et al. |
| 6,214,694 | B1 | 4/2001 | Leobandung et al. |
| 6,225,158 | B1 | 5/2001 | Furukawa et al. |
| 6,245,613 | B1 | 6/2001 | Hsu et al. |
| 6,252,281 | B1 | 6/2001 | Yamamoto et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,310,809 | B1 | 10/2001 | Roohparvar et al. |
| 6,320,227 | B1 | 11/2001 | Lee et al. |
| 6,333,532 | B1 | 12/2001 | Davari et al. |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B2 | 10/2002 | Fujita et al. |
| 6,492,211 | B1 | 12/2002 | Divakaruni et al. |
| 6,518,105 | B1 | 2/2003 | Yang et al. |
| 6,531,754 | B1 | 3/2003 | Nagano et al. |
| 6,538,916 | B2 | 3/2003 | Ohsawa |
| 6,544,837 | B1 | 4/2003 | Divakaruni et al. |
| 6,548,848 | B2 | 4/2003 | Horiguchi et al. |
| 6,549,450 | B1 | 4/2003 | Hsu et al. |
| 6,552,398 | B2 | 4/2003 | Hsu et al. |
| 6,556,477 | B2 | 4/2003 | Hsu et al. |
| 6,566,177 | B1 | 5/2003 | Radens et al. |
| 6,567,330 | B2 | 5/2003 | Fujita et al. |
| 6,590,258 | B2 | 7/2003 | Divakauni et al. |
| 6,590,259 | B2 | 7/2003 | Adkisson et al. |
| 6,617,651 | B2 | 9/2003 | Ohsawa |
| 6,621,725 | B2 | 9/2003 | Ohsawa |
| 6,632,723 | B2 | 10/2003 | Watanabe et al. |
| 6,650,565 | B1 | 11/2003 | Ohsawa |
| 6,781,875 | B2 * | 8/2004 | Ohsawa ..................... 365/174 |
| 7,123,509 | B2 | 10/2006 | Ohsawa |
| 7,301,838 | B2 * | 11/2007 | Waller et al. ................. 365/205 |
| 2001/0055859 | A1 | 12/2001 | Yamada et al. |
| 2002/0030214 | A1 | 3/2002 | Horiguchi |
| 2002/0034855 | A1 | 3/2002 | Horiguchi et al. |
| 2002/0036322 | A1 | 3/2002 | Divakaunl et al. |
| 2002/0051378 | A1 | 5/2002 | Ohsawa |
| 2002/0064913 | A1 | 5/2002 | Adkisson et al. |
| 2002/0070411 | A1 | 6/2002 | Vermandel et al. |
| 2002/0072155 | A1 | 6/2002 | Liu et al. |
| 2002/0076880 | A1 | 6/2002 | Yamada et al. |
| 2002/0086463 | A1 | 7/2002 | Houston et al. |
| 2002/0089038 | A1 | 7/2002 | Ning |
| 2002/0098643 | A1 | 7/2002 | Kawanaka et al. |
| 2002/0110018 | A1 | 8/2002 | Ohsawa |
| 2002/0114191 | A1 | 8/2002 | Iwata et al. |
| 2002/0130341 | A1 | 9/2002 | Horiguchi et al. |
| 2002/0160581 | A1 | 10/2002 | Watanabe et al. |
| 2002/0180069 | A1 | 12/2002 | Houston |
| 2003/0003608 | A1 | 1/2003 | Arikado et al. |
| 2003/0015757 | A1 | 1/2003 | Ohsawa |
| 2003/0035324 | A1 | 2/2003 | Fujita et al. |
| 2003/0057487 | A1 | 3/2003 | Yamada et al. |
| 2003/0057490 | A1 | 3/2003 | Nagano et al. |
| 2003/0102497 | A1 | 6/2003 | Fried et al. |
| 2003/0112659 | A1 | 6/2003 | Ohsawa |
| 2003/0123279 | A1 | 7/2003 | Aipperspach et al. |
| 2003/0146488 | A1 | 8/2003 | Nagano et al. |
| 2003/0151112 | A1 | 8/2003 | Yamada et al. |
| 2004/0227166 | A1 | 11/2004 | Portmann et al. |
| 2005/0226070 | A1 | 10/2005 | Ohsawa |
| 2005/0232043 | A1 | 10/2005 | Ohsawa |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |

| | | |
|---|---|---|
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 744 | 12/2001 |
| EP | 1 626 663 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | S62-007149 A | 1/1987 |
| JP | 62-272561 | 11/1987 |
| JP | 02-294076 | 2/1991 |
| JP | 03171768 | 7/1991 |
| JP | H04-176163 A | 6/1992 |
| JP | 08213624 | 8/1996 |
| JP | H08-213624 A | 8/1996 |
| JP | 8-274277 | 10/1996 |
| JP | H08-316337 A | 11/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-0981 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-68877 A | 3/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Loncar et al., IEEE Proc. 22nd International Conference on Microelectronics (MIEL 2000), vol. 2, NIS, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15μm SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An 18.5ns 128Mb SOI DRAM with a Floating Body Cell", Ohsawa et al., 2005 IEEE International Solid-State Circuits Conference, Feb. 9, 2005, pp. 458-459, 609.

"A Capacitorless Double-Gate DRAM Cell", Kuo et al., IEEE Electron Device Letters, vol. 23, No. 6, Jun. 2002, pp. 345-347.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisms of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).
"Toshiba's DRAM Cell Piggybacks on SOI Wafer", Y. Hara, EE Times, Jun. 2003.
"Memory Design Using a One-Transistor Gain Cell on SOI", Ohsawa et al., IEEE Journal of Solid-State Circuits, vol. 37, No. 11, Nov. 2002, pp. 1510-1522.
"Opposite Side Floating Gate SOI Flash Memory Cell", Lin et al., IEEE, Mar. 2000, pp. 12-15.
"Advanced TFT SRAM Cell Technology Using a Phase-Shift Lithography", Yamanaka et al., IEEE Transactions on Electron Devices, vol. 42, No. 7, Jul. 1995, pp. 1305-1313.
"Soft-Error Characteristics in Bipolar Memory Cells with Small Critical Charge", Idei et al., IEEE Transactions on Electron Devices, vol. 38, No. 11, Nov. 1991, pp. 2465-2471.
"An SOI 4 Transistors Self-Refresh Ultra-Low-Voltage Memory Cell", Thomas et al., IEEE, Mar. 2003, pp. 401-404.
"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.
"High-Performance Embedded SOI DRAM Architecture for the Low-Power Supply", Yamauchi et al., IEEE Journal of Solid-State Circuits, vol. 35, No. 8, Aug. 2000, pp. 1169-1178.
"An SOI-DRAM with Wide Operating Voltage Range by CMOS/SIMOX Technology", Suma et al., 1994 IEEE International Solid-State Circuits Conference, pp. 138-139.
"A Capacitorless DRAM Cell on SOI Substrate", Wann et al., IEEE IEDM, 1993, pp. 635-638.
"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.
"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.
"Hot-Carrier Effects in Thin-Film Fully Depleted SOI MOSFET's", Ma et al., IEEE Electron Device Letters, vol. 15, No. 6, Jun. 1994, pp. 218-220.
"Design Analysis of Thin-Body Silicide Source/Drain Devices", 2001 IEEE International SOI Conference, Oct. 2001, pp. 21-22.
"SOI MOSFET on Low Cost SPIMOX Substrate", Iyer et al., IEEE IEDM, Sep. 1998, pp. 1001-1004.
"Simulation of Floating Body Effect in SOI Circuits Using BSIM3SOI", Tu et al., Proceedings of Technical Papers (IEEE Cat No. 97TH8303), pp. 339-342, Nov. 1995.
"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.
"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.
"Hot-Carrier-Induced Degradation in Ultra-Thin-Film Fully-Depleted SOI MOSFETs", Yu et al., Solid-State Electronics, vol. 39, No. 12, 1996, pp. 1791-1794.
Hot-Carrier Effect in Ultra-Thin-Film (UTF) Fully-Depleted SOI MOSFET's, Yu et al., 54th Annual Device Research Conference Digest (Cat. No. 96TH8193), pp. 22-23, 1994.
"SOI MOSFET Design for All-Dimensional Scaling with Short Channel, Narrow Width and Ultra-thin Films", Chan et al., IEEE IEDM, 1995, pp. 631-634.
"A Novel Silicon-On-Insulator (SOI) MOSFET for Ultra Low Voltage Operation", Assaderaghi et al., 1994 IEEE Symposium on Low Power Electronics, pp. 58-59.
"Interface Characterization of Fully-Depleted SOI MOSFET by a Subthreshold I-V Method", Yu et al., Proceedings 1994 IEEE International SOI Conference, Oct. 1994, pp. 63-64.
"A Capacitorless Double-Gate DRAM Cell Design for High Density Applications", Kuo et al., IEEE IEDM, Feb. 2002, pp. 843-846.
"A Dynamic Threshold Voltage MOSFET (DTMOS) for Ultra-Low Voltage Operation", Assaderaghi et al., IEEE IEDM, 1994, pp. 809-812.

"A Dynamic Threshold Voltage MOSFET (DTMOS) for Very Low Voltage Operation", Assaderaghi et al., IEEE Electron Device Letters, vol. 15, No. 12, Dec. 1994, pp. 510-512.
"A Capacitorless DRAM Cell on SOI Substrate", Wann et al., IEEE IEDM 1993, pp. 635-638.
"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).
"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.
"An Analytical Model for the Misis Structure in SOI MOS Devices", Tack et al., Solid-State Electronics vol. 33, No. 3, 1990, pp. 357-364.
"A Long Data Retention SOI DRAM with the Body Refresh Function", Tomishima et al., IEICE Trans. Electron., vol. E80-C, No. 7, Jul. 1997, pp. 899-904.
"A Simple 1-Transistor Capacitor-Less Memory Cell for High Performance Embedded DRAMs", Fazan et al., IEEE 2002 Custom Integrated Circuits Conference, Jun. 2002, pp. 99-102.
"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.
"Capacitor-Less 1-Transistor DRAM", Fazan et al., 2002 IEEE International SOI Conference, Oct. 2002, pp. 10-13.
"SOI (Silicon-on-Insulator) for High Speed Ultra Large Scale Integration", C. Hu, Jpn. J. Appl. Phys. vol. 33 (1994) pp. 365-369, Par. 1, No. 1B, Jan. 1994.
"Source-Bias Dependent Charge Accumulation in P+-Poly Gate SOI Dynamic Random Access Memory Cell Transistors", Sim et al., Jpn. J. Appl. Phys. vol. 37 (1998) pp. 1260-1263, Par. 1, No. 3B, Mar. 1998.
"Suppression of Parasitic Bipolar Action in Ultra-Thin-Film Fully-Deppleted CMOS/SIMOX Devices by Ar-Ion Implantation into Source/Drain Regions", Ohno et al., IEEE Transactions on Electron Devices, vol. 45, No. 5, May 1998, pp. 1071-1076.
dRAM Design Using the Taper-Isolated Dynamic RAM Cell, Leiss et al., IEEE Transactions on Electron Devices, vol. ED-29, No. 4, Apr. 1982, pp. 707-714.
"Fully Isolated Lateral Bipolar-MOS Transistors Fabricated in Zone-Melting-Recrystallized Si films on SiO2", Tsaur et al., IEEE Electron Device Letters, vol. EDL-4, No. 8, Aug. 1983, pp. 269-271.
"Silicon-On-Insulator Bipolar Transistors", Rodder et al., IEEE Electron Device Letters, vol. EDL-4, No. 6, Jun. 1983, pp. 193-195.
"Characteristics and Three-Dimensional Integration of MOSFET's in Small-Grain lPCVD Polycrystalline Silicon", Malhi et al., IEEE Transactions on Electron Devices, vol. ED-32, No. 2, Feb. 1985, pp. 258-281.
"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).
"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).
"Embedded DRAM Process Technology", M. Yamawaki, Proceedings of the Symposium on Semiconductors and Integrated Circuits Technology, 1998, vol. 55, pp. 38-43.
"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.
"Dynamic floating body control SOI CMOS for power managed multimedia ULSIs", F. Morishita et al., Proc. CICC, pp. 263-266, 1997.
"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9,. Sep. 2005, pp. 655-657.

"Novel Capacitorless 1T-DRAM From Single-gate PD-SOI to Double-gate FinDRAM", ATIP Scoops, May 9, 2005, 9 pages.

"A Hgih-Speed Clamped Bit-Line Current-Mode Sense Amplifier", T. Blalock, IEEE Journal of Solid-State Circuits, vol. 26, No. 4, Apr. 1991, pp. 542-548.

* cited by examiner

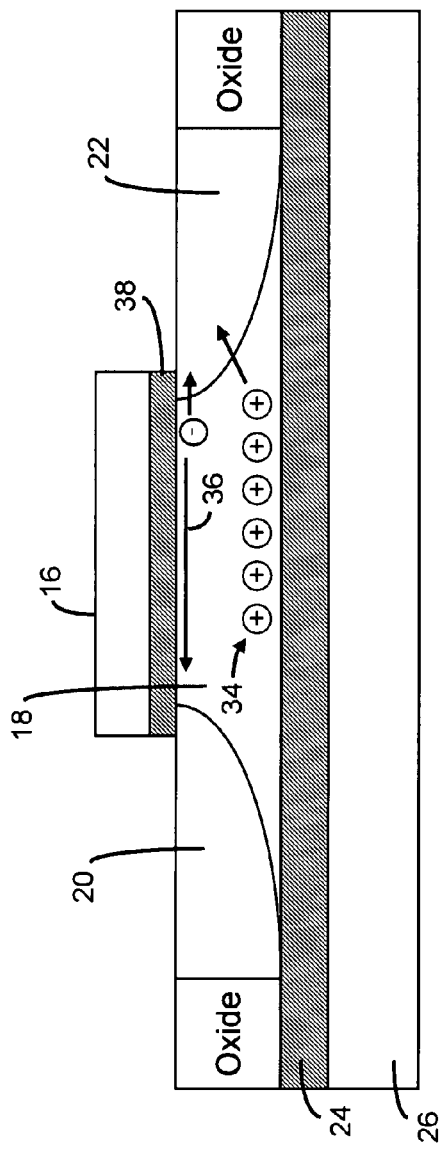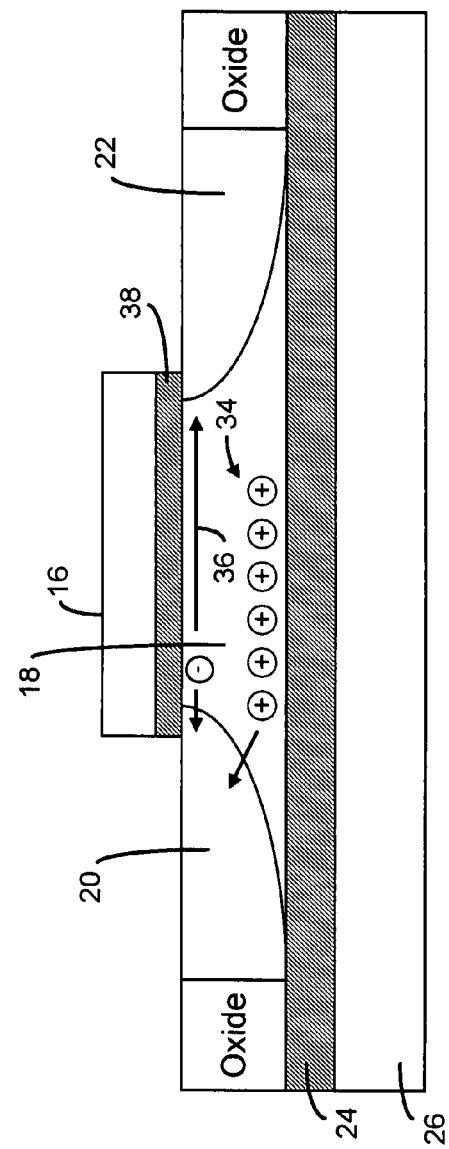

US 7,486,563 B2

SENSE AMPLIFIER CIRCUITRY AND ARCHITECTURE TO WRITE DATA INTO AND/OR READ FROM MEMORY CELLS

RELATED APPLICATIONS

This application is a divisional of application Ser. No. 11/299,590, entitled "Sense Amplifier Circuitry and Architecture to Write Data into and/or Read from Memory Cells" (now U.S. Pat. No. 7,301,838), filed Dec. 12, 2005. This non-provisional patent application and the '590 application claim priority to U.S. Provisional application Ser. No. 60/635,709, entitled "Sense Amplifier Circuitry and Architecture to Write Data Into and/or Read from Memory Cells", filed Dec. 13, 2004. The contents of this provisional application are incorporated by reference herein in their entirety.

BACKGROUND

The inventions relate to semiconductor integrated circuit devices (for example, memory devices); and more particularly, in one aspect, to circuitry and techniques to write and read, sense and/or sample a data state to/from memory cells of a memory array and/or device, for example, a semiconductor dynamic random access memory ("DRAM") device, wherein the memory cells have an electrically floating body in which an electrical charge is stored.

There is a continuing trend to employ and/or fabricate advanced integrated circuits using techniques, materials and devices that improve performance, reduce leakage current and enhance overall scaling. Silicon-on-Insulator (SOI) is a material in which such devices may be fabricated on or in (hereinafter collectively "on"). Such devices are known as SOI devices and include, for example, partially depleted (PD), fully depleted (FD) devices, multiple gate devices (for example, double or triple gate), and Fin-FET SOI devices have demonstrated improved performance (for example, speed), reduced leakage current characteristics and considerable enhancement in scaling.

One type of DRAM memory cell is based on, among other things, a floating body effect of SOI transistors. (See, for example, U.S. patent application Ser. No. 10/450,238, Fazan et al., filed Jun. 10, 2003 and entitled "Semiconductor Device", hereinafter "Semiconductor Memory Device Patent Application"). In this regard, the memory cell may consist of a PD or a FD SOI transistor (or transistor formed in bulk material/substrate) having a gate dielectric, which is disposed adjacent to the body and separated therefrom by a channel. The body region of the transistor is electrically floating in view of the insulation or non-conductive region (for example, in bulk-type material/substrate) disposed beneath the body region. The state of the memory cell is determined by the concentration of charge within the body region of the SOI transistor.

With reference to FIGS. 1A, 1B and 1C, in one embodiment, semiconductor memory cell array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in SOI material/substrate) or non-conductive region (for example, in bulk-type material/substrate). The insulation or non-conductive region may be disposed on or in substrate 26.

Data is written into or read from a selected memory cell by applying suitable control signals to selected word line(s) 28, selected source line(s) 30 and/or selected bit line(s) 32. In response, charge carriers are accumulated in or emitted and/or ejected from electrically floating body region 18 wherein the data states are defined by the amount of carriers within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

As mentioned above, memory cell 12 of array 10 operates by accumulating in or emitting/ejecting majority carriers (electrons or holes) 34 from body region 18 of, for example, an N-channel transistor. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 34 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carries in the body region relative to an unprogrammed device and/or a device that is programmed with a logic low or State "0". In contrast, a logic low or State "0" corresponds to a reduced concentration of majority carries in the body region relative to an unprogrammed device and/or a device that is programmed with a logic high or State "1".

As mentioned above, conventional techniques to write or program a logic low (State "0") in memory cell 12 may be accomplished by removing majority carriers from body region 18 through either source region 20 or drain region 22 of electrically floating body transistor 14 of memory cell 12. In this regard, in one embodiment, majority carriers (in this example, "holes") 34 in body region 18 of memory cells 12 are removed from memory cell 12 through drain region 22. (See, FIG. 3A). A positive current 36 (electrons flowing in opposite direction) flows from drain region 22 to source region 20 due to a channel forming in a portion of body region 18 immediately beneath gate oxide 38 when writing or programming a logic low (State "0"). Where the majority carriers (in this example, "holes") 34 are removed from memory cell 12 through source region 20, positive current 36 (electrons flowing in opposite direction) flows from source region 20 to drain region 22 as a result of channel formation when writing or programming a logic low (State "0"). (See, FIG. 3B).

Conventional techniques may employ a two-cycle write or program technique to store a desired data state in memory cells 12. In this regard, in one embodiment, in the first cycle a logic low (State "0") is written into all memory cells 12 connected to word line 28; in the second cycle, a logic high (State "1") is selectively written into memory cells 12 while an inhibit signal or voltage is applied to those memory cells 12 that are to maintain a logic low or State "0". In this way, certain memory cells 12 connected to a given word line may be written or programmed to a logic low (State "0") using a first word line voltage; and certain other memory cells 12, also connected to the given word line, may be written or programmed to a logic high (State "1") using a second word line voltage. (See, for example, application Ser. No. 10/840,009, which was filed by Ferrant et al. on May 6, 2004, and entitled "Semiconductor Memory Device and Method of Operating Same").

Several techniques may be implemented to read the data stored in the memory cell. For example, a current sense amplifier may be employed to read the data stored in memory cells. In this regard, a current sense amplifier may compare the cell current to a reference current, for example, the current of a reference cell. From that comparison, it may be determined whether the memory cell contained a logic high data state (relatively more majority carriers contained within body region) or logic low data state (relatively less majority carriers contained within body region). The differences of the charge stored in the body of the transistor affect the threshold voltage of the transistor, which in turn affects the current conducted by the transistor when switched into its conductive state.

In particular, with reference to FIG. 4, sense amplifier 40 (for example, a cross-coupled sense amplifier) compares the current conducted by transistor 14 of memory cell 12 with a reference current generated by reference current generator 42. The magnitude of the reference current generally lies between the magnitudes of the currents conducted in the logic high data state and logic low data state of memory cell 12. The sense amplifier 40 compares the reference current to the current produced by memory cell 12 (the current varies depending on whether memory cell 12 is either in a logic high data state or logic low data state). Based on that comparison, sense amplifier 40 generates or outputs an output signal (on output 44) having a positive or negative polarity, depending upon whether memory cell 12 stored a logic high or logic low binary data state. (See, for example, U.S. Pat. No. 6,567,330; and "Memory Design Using a One-Transistor Cell on SOI", IEEE Journal of Solid-State Circuits, Vol. 37, No. 11, November 2002).

The data sense circuitry/architecture and technique of the prior art have a number of shortcomings. For example, the data sense circuitry/architecture and technique of the prior art typically employ multiplexer circuitry to selectively apply one or more bit lines to the input of a sense amplifier bank. (See, for example, U.S. Pat. Nos. 6,567,330 and 6,650,565). Such circuitry/architectures often implement a pitch that differs from the pitch of the memory cell array. The bit line selection circuitry often adds complexity and latency to the read as well as write back operations. In addition, the bit line selection circuitry may introduce unwanted capacitance and inductance which may reduce the margin of the read operation. Finally, incorporation of bit line selection circuitry into the architecture typically eliminates the possibility of reading or writing an entire row of data.

There is a need for a data sense architecture and technique that eliminate the shortcomings of the prior art architectures and technique. For example, there is a need for an architecture and technique that is suitably and properly pitched to the array of memory cells. In this way, an entire row of data may be read, sampled and/or sensed without the complexity and latency of data sense architectures and techniques that implement bit line selection circuitry.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to an integrated circuit device comprising a bit line having a plurality of memory cells coupled thereto, wherein each memory cell provides at least two current values (each current being representative of, for example, a respective data state). The integrated circuit device further includes a cross-coupled sense amplifier including first and second input nodes, each input node having an intrinsic capacitance, wherein the cross-coupled sense amplifier includes a first transistor having first and second regions and a gate, wherein the first region is connected to or forms a part of the first input node, and wherein the first input node is coupled to the bit line to receive a current which is representative of a data state of a selected memory cell, wherein the selected memory cell is one of the plurality of memory cells which are coupled to the bit line. The sense amplifier also includes a second transistor having first and second regions and a gate, wherein the first region of the second transistor is connected to or forms a part of the second input node, and wherein the second input node receives a reference current. Reference current generation circuitry is coupled to the second input node of the sense amplifier and generates a current that is representative of the reference current.

In operation, the cross-coupled sense amplifier determines the data state of the selected memory cell based on voltages developed on the first and second input nodes provided by (1) charging or discharging the intrinsic capacitance of the first input node by the current which is representative of the data state of the selected memory cell, and (2) charging or discharging the intrinsic capacitance of the second input node by the reference current.

In one embodiment, the memory cells include an electrically floating body transistor having a source region, a drain region, a body region which is disposed between the source region and the drain region, wherein the body region is electrically floating, and a gate disposed over the body region. Each memory cell includes a first data state representative of a first charge in the body region of the transistor, and a second data state representative of a second charge in the body region of the transistor.

In one embodiment, the gate of the first transistor of the sense amplifier may be connected to the second input node, and the gate of the second transistor of the sense amplifier is connected to the first input node. The second region of the first transistor of the sense amplifier may be connected to a first reference voltage, and the second region of the second transistor of the sense amplifier is connected to the first reference voltage.

The cross-coupled sense amplifier may further include third and fourth transistors, each having first and second regions and a gate, wherein the first regions of the third and fourth transistors are connected and coupled to a second reference voltage, the second region of the third transistor is connected to or forms a part of the first input node, the second region of the fourth transistor is connected to or forms a part of the second input node, the gate of the third transistor is connected to the second input node, and the gate of the fourth transistor is connected to the first input node.

The integrated circuit device of this aspect of the inventions may include a first current mirror circuit disposed between the bit line and the first input node. The first current mirror circuit may include an input which is connected to the bit line and an output which is connected to the first input node. The first current mirror circuit, in operation, may decouple the bit line capacitance from the first input node.

In one embodiment, the integrated circuit device further includes a second current mirror circuit disposed between the reference current generation circuitry and the second input node. The second current mirror circuit may include an input which is connected to the reference current generation circuitry and an output which is connected to the second input node.

The integrated circuit device of this aspect of the inventions may also include write back circuitry, coupled to the first and second input nodes of the cross-coupled sense amplifier, to restore the data state of the selected memory cell. Voltage level shifter circuitry may be employed and disposed between the write back circuitry and the first and second input nodes of the cross-coupled sense amplifier.

In another principal aspect, an integrated circuit device comprising a bit line having a plurality of memory cells coupled thereto wherein each memory cell provides at least two current values (each current being representative of, for example, a respective data state). The integrated circuit device further includes a cross-coupled sense amplifier including first and second input nodes, each input node having an intrinsic capacitance, wherein the cross-coupled sense amplifier includes a first transistor having first and second regions and a gate, wherein the first region is connected to or forms a part of the first input node, and wherein the first input node is coupled to the bit line to receive a current which is representative of a data state of a selected memory cell, wherein the selected memory cell is one of the plurality of memory cells which are coupled to the bit line. The sense amplifier also includes a second transistor having first and second regions and a gate, wherein the first region of the second transistor is connected to or forms a part of the second input node, and wherein the second input node receives a reference current.

Reference current generation circuitry is coupled to the second input node of the sense amplifier and generates a current that is representative of the reference current. The integrated circuit device in this aspect includes a first current mirror circuit having an input which is connected to the bit line and an output which is connected to the first input node, wherein the first current mirror circuit, in operation, decouples the bit line capacitance from the first input node.

In operation, the cross-coupled sense amplifier determines the data state of the selected memory cell based on voltages developed on the first and second input nodes provided by (1) charging or discharging the intrinsic capacitance of the first input node by the current which is representative of the data state of the selected memory cell, and (2) charging or discharging the intrinsic capacitance of the second input node by the reference current.

The memory cells may include an electrically floating body transistor having a source region, a drain region, a body region which is disposed between the source region and the drain region, wherein the body region is electrically floating, and a gate disposed over the body region. Each memory cell includes a first data state representative of a first charge in the body region of the transistor, and a second data state representative of a second charge in the body region of the transistor.

In one embodiment, the gate of the first transistor of the sense amplifier is connected to the second input node, and the gate of the second transistor of the sense amplifier is connected to the first input node. Further, the second region of the first transistor of the sense amplifier is connected to a first reference voltage, and the second region of the second transistor of the sense amplifier is connected to the first reference voltage.

In one embodiment, the cross-coupled sense amplifier further includes third and fourth transistors, each having first and second regions and a gate. In this embodiment, the first regions of the third and fourth transistors are connected and coupled to a second reference voltage, the second region of the third transistor is connected to or forms a part of the first input node, the second region of the fourth transistor is connected to or forms a part of the second input node, the gate of the third transistor is connected to the second input node, and the gate of the fourth transistor is connected to the first input node.

The integrated circuit device may include a second current mirror circuit disposed between the reference current generation circuitry and the second input node, wherein the second current mirror circuit includes an input which is connected to the reference current generation circuitry and an output which is connected to the second input node. The integrated circuit device may also include write back circuitry, coupled to the first and second input nodes of the cross-coupled sense amplifier, to restore the data state of the selected memory cell or write a different data state to the selected memory cell. Indeed, a voltage level shifter circuitry may be disposed between the write back circuitry and the first and second input nodes of the cross-coupled sense amplifier.

In yet another principal aspect, an integrated circuit device comprising a bit line having a plurality of memory cells. The integrated circuit device of this aspect of the inventions includes a cross-coupled sense amplifier having a pitch that is substantially the same as a pitch of the bit line. The cross-coupled sense amplifier further includes first and second input nodes, each input node having an intrinsic capacitance, wherein the cross-coupled sense amplifier includes a first transistor having first and second regions and a gate, wherein the first region is connected to or forms a part of the first input node, and wherein the first input node is coupled to the bit line to receive a current which is representative of a data state of a selected memory cell, wherein the selected memory cell is one of the plurality of memory cells which are coupled to the bit line. The sense amplifier also includes a second transistor having first and second regions and a gate, wherein the first region of the second transistor is connected to or forms a part of the second input node, and wherein the second input node receives a reference current.

Reference current generation circuitry is coupled to the second input node of the sense amplifier and generates a current that is representative of the reference current. The integrated circuit device in this aspect includes a first current mirror circuit having an input which is connected to the bit line and an output which is connected to the first input node, wherein the first current mirror circuit, in operation, decouples the bit line capacitance from the first input node.

In operation, the cross-coupled sense amplifier determines the data state of the selected memory cell based on voltages developed on the first and second input nodes provided by (1a) charging or discharging the intrinsic capacitance of the first input node by the current which is representative of the data state of the selected memory cell and (1b) charging or discharging the intrinsic capacitance of the second input node by the reference current, or (2) by writing to cross-coupled sense amplifier through input/output circuitry.

The integrated circuit device of this aspect may include one or more of the features of the previously described aspects of the inventions. For the sake of brevity, those discussions will not be repeated.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many others embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

FIGS. 3A and 3B are exemplary schematic illustrations of the charge relationship pertaining to conventional techniques for programming or writing a logic low or State "0" into an electrically floating body transistor (for example, a PD-SOI NMOS);

DETAILED DESCRIPTION

There are many inventions described and illustrated herein. In one aspect, the present inventions are directed to a technique of, and circuitry for sampling, sensing, reading and/or determining the data state of a memory cell of a memory cell array (for example, a memory cell array having a plurality of memory cells which consist of an electrically floating body transistor). In one embodiment, the present inventions include sense amplifier circuitry that is relatively compact and pitched to the array of memory cells such that a row of data may be read, sampled and/or sensed during a read operation. In this regard, an entire row of memory cells may be accessed and read during one operation which, relative to at least architecture employing multiplexer circuitry, may minimize, enhance and/or improve read latency and read access time, memory cell disturbance and/or simplify the control of the sense amplifier circuitry and access thereof.

In this embodiment, the sense amplifier circuitry also includes write back circuitry to modify or "re-store" the data read, sampled and/or sensed during a read operation or a refresh operation in the context of a DRAM array. The sense amplifier circuitry of this embodiment restores or refreshes data in an entire row of volatile and/or destructive read type memory cells in parallel which, relative to at least architecture employing multiplexer circuitry, may minimize, enhance and/or improve write back and read latency parameters. Also, data that has been read, sampled and/or sensed by the sense amplifier circuitry during a read operation may be modified before being written back to one or more of the memory cells of the selected row of the array of memory cells.

Notably, the present inventions may be implemented in conjunction with any memory cell technology that generates at least two current values (each current being representative of, for example, a respective data state). In this regard, the memory technology may be an electrically floating body transistor (P-channel or N-channel type transistors) described above or any other technology whether now known or later developed. Indeed, all such memory technologies are considered to fall within the scope of the present inventions.

Figure 1A:
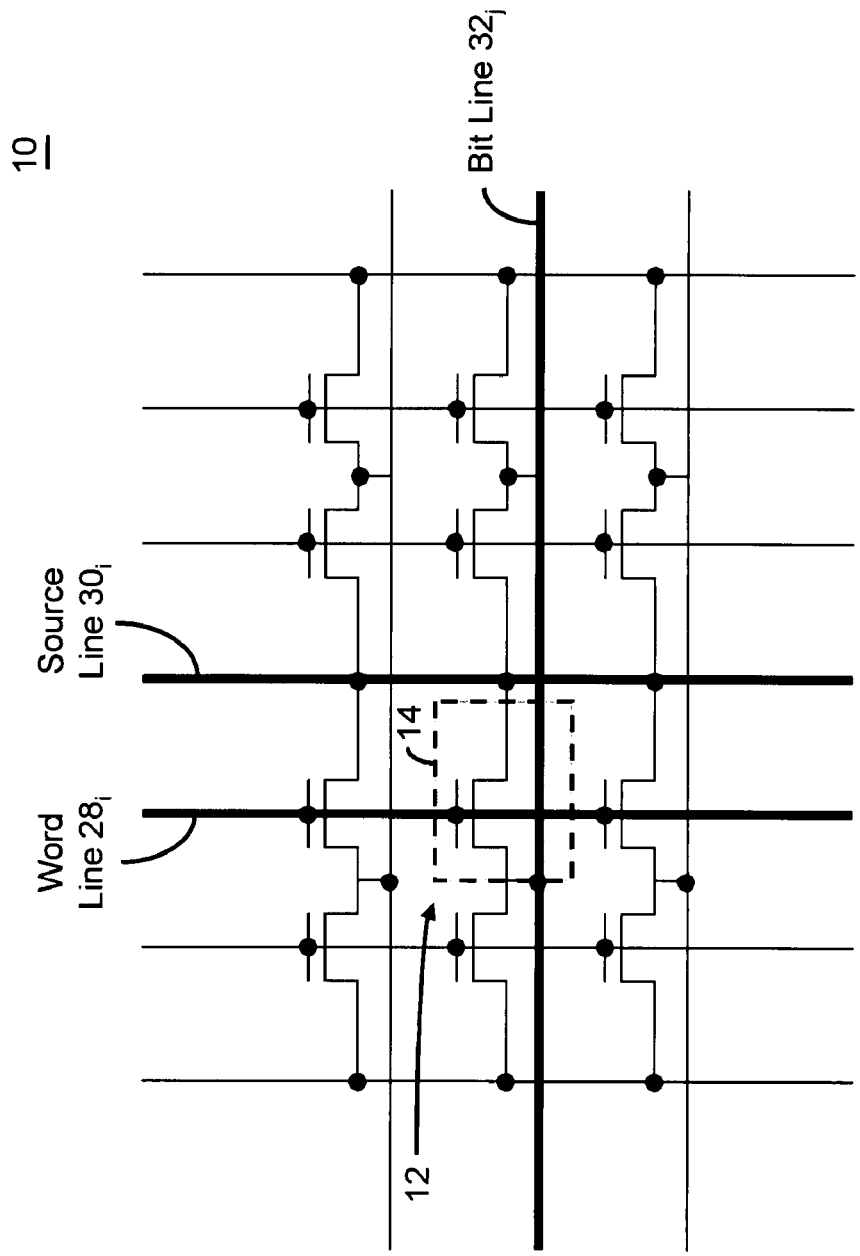
FIG. 1A is a schematic representation of a prior art semiconductor DRAM array including a plurality of memory cells comprised of one electrically floating body transistor.
Figure 1B:
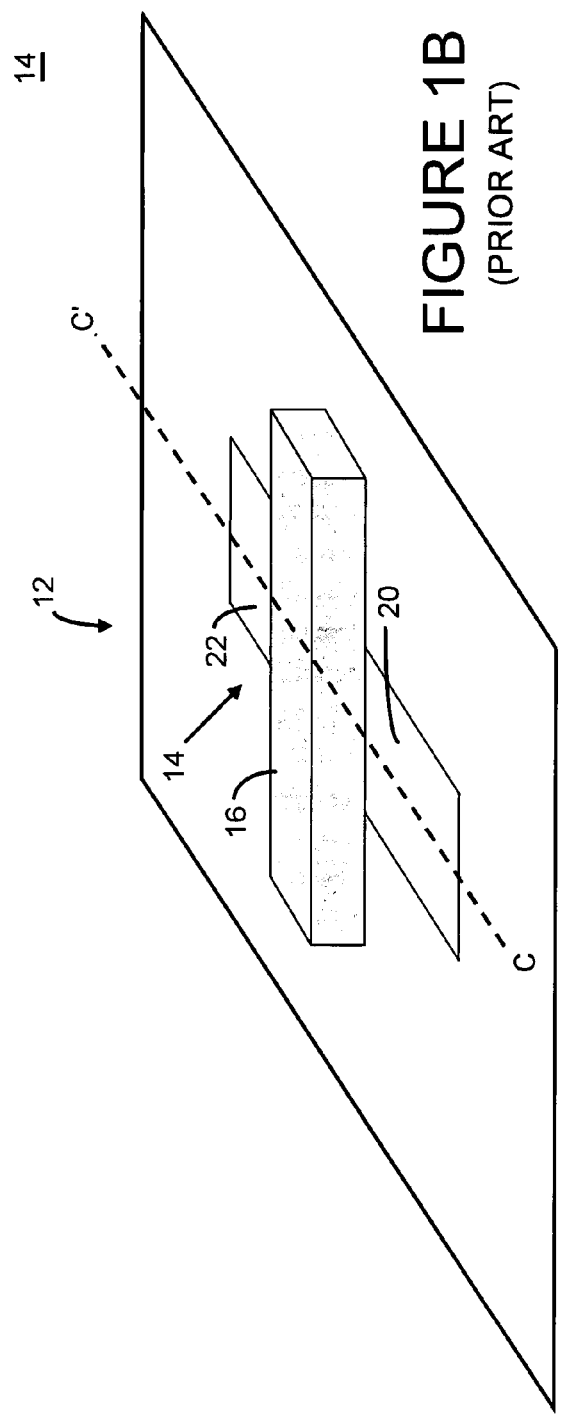
FIG. 1B is a three dimensional view of an exemplary prior art memory cell comprised of one electrically floating body transistor (PD-SOI NMOS)
Figure 1C:
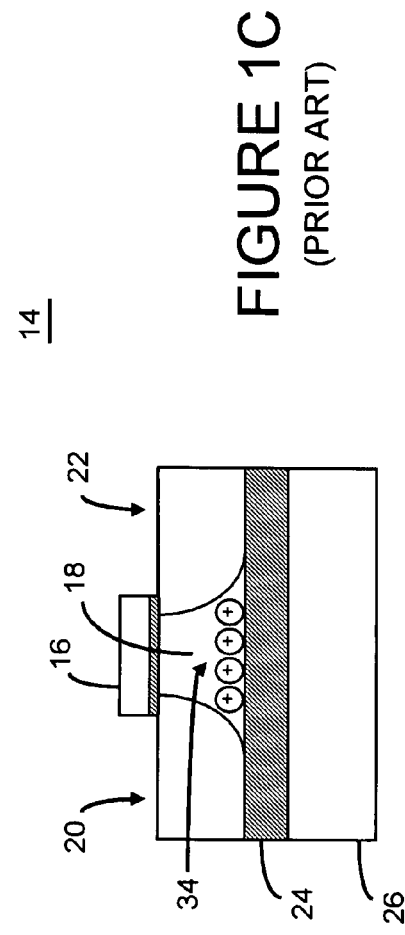
FIG. 1C is a cross-sectional view of the prior art memory cell of FIG. 1B, cross-sectioned along line C-C'.
Figure 2A:
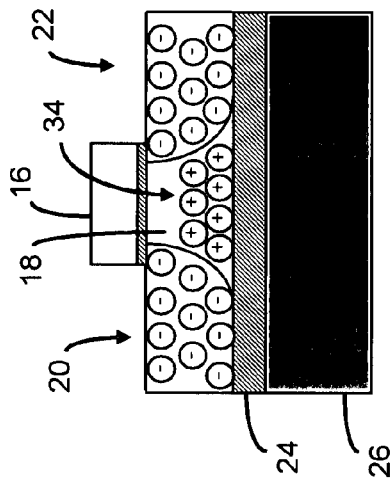
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
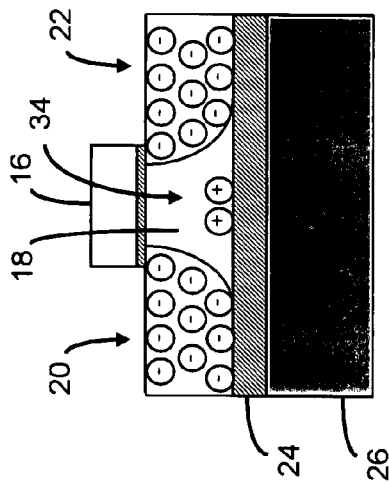
Figure 4:
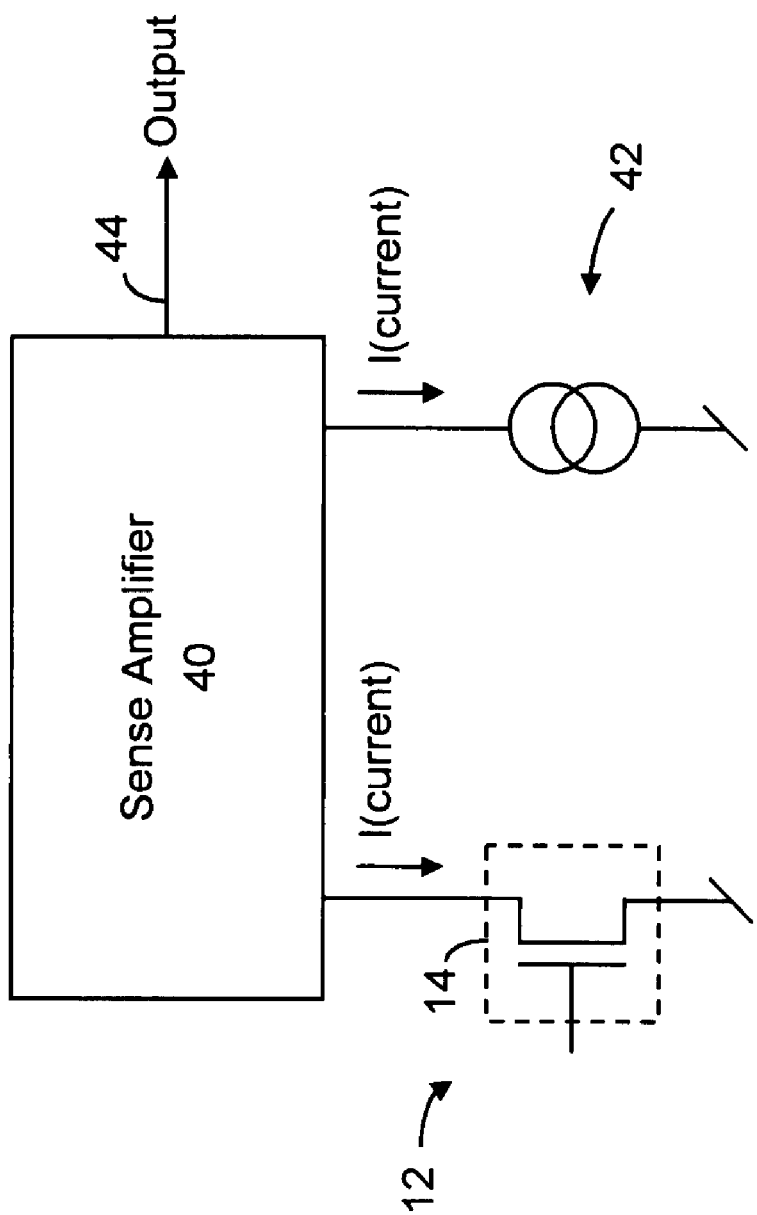
FIG. 4 is a block-diagram illustration of a conventional circuit configuration to read data from a memory cell.
Figure 5A:
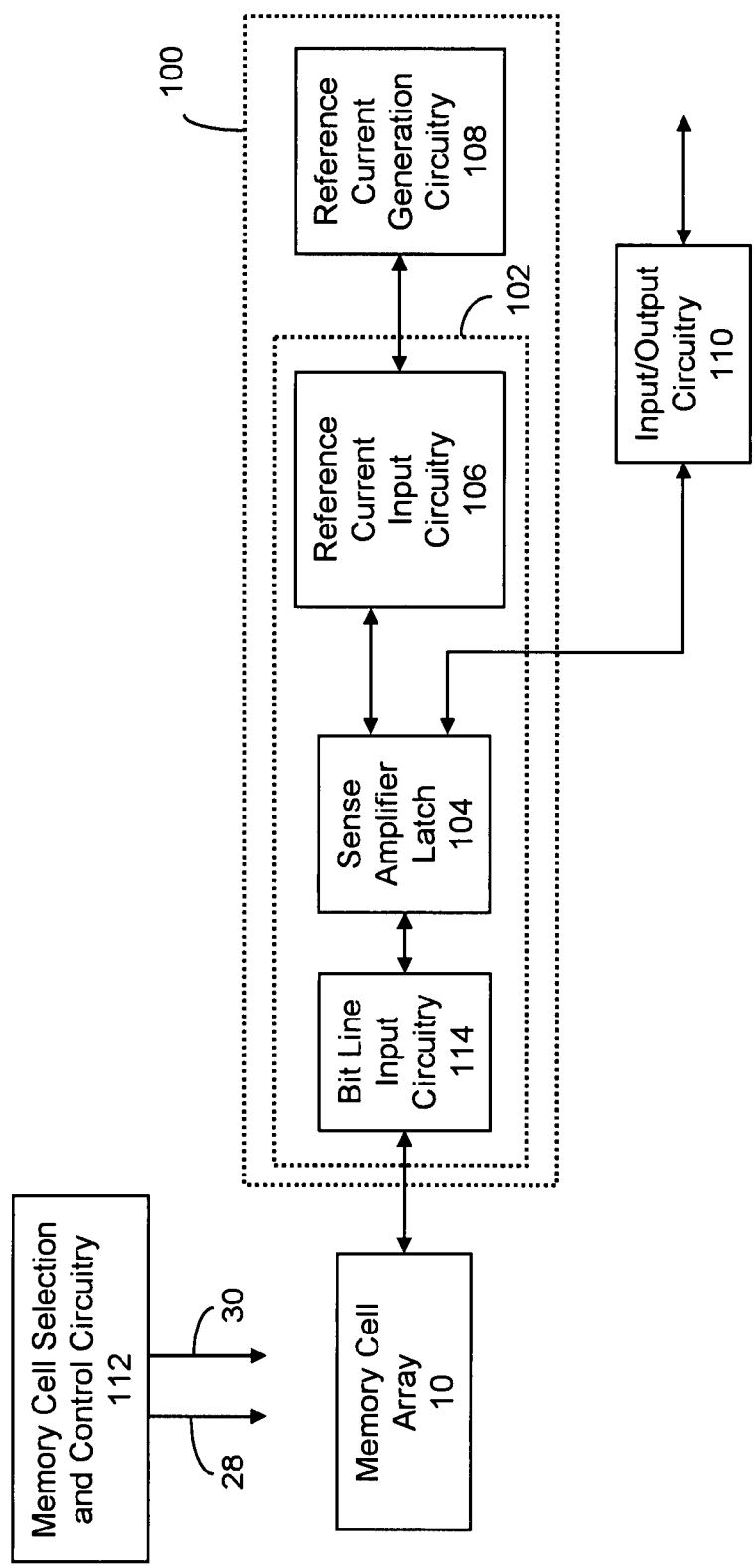
FIGS. 5A and 5B are schematic block diagrams of embodiments of the data sense and write circuitry, in conjunction with a memory cell array and input/output circuitry, according certain aspects of the present inventions.
Figure 6:
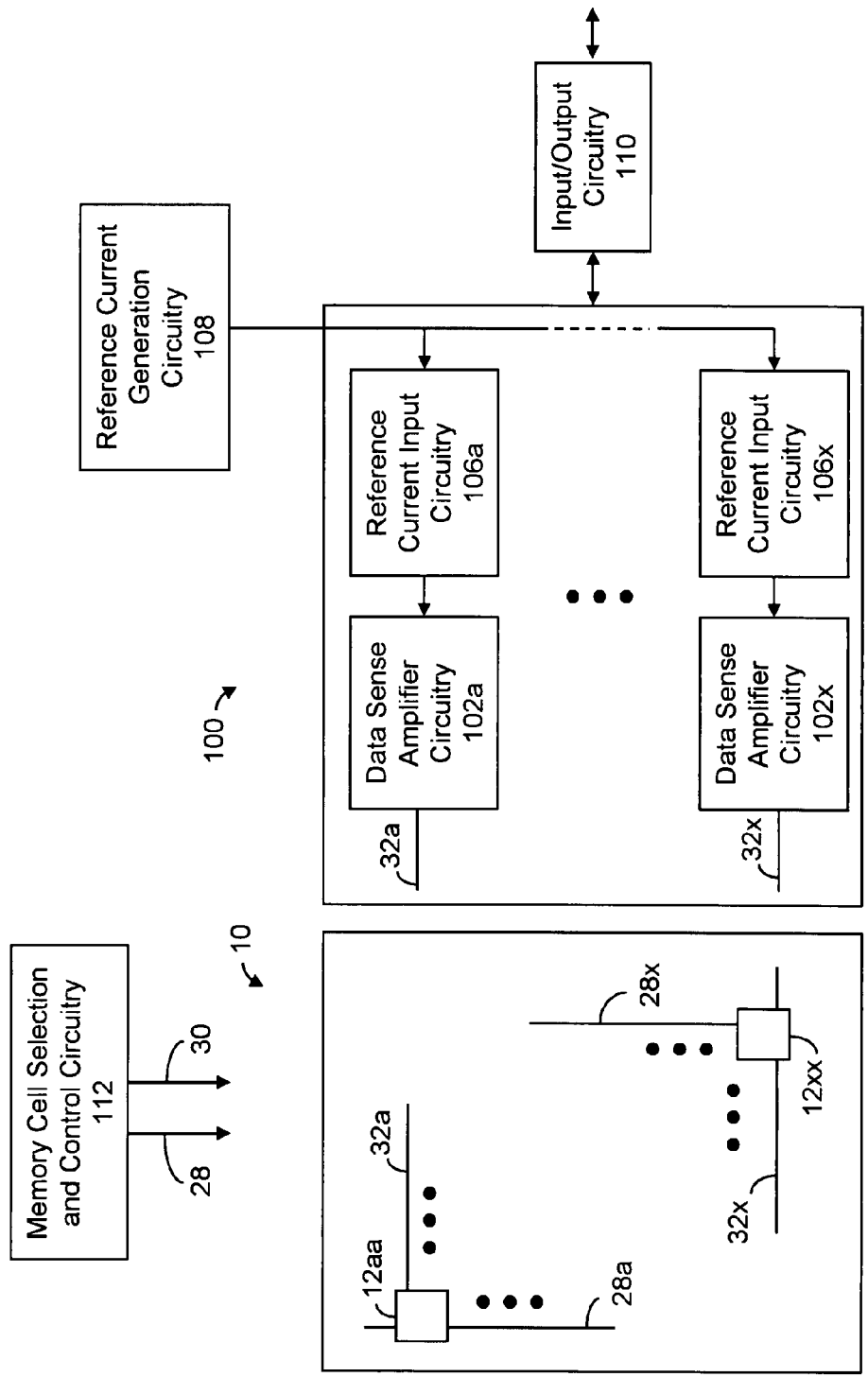
FIG. 6 is a block diagram representation of a memory cell array, including a plurality of memory cells (for example, the memory cells illustrated in FIGS. 1A-3B) in conjunction with data sense and write circuitry, according an embodiment of the present inventions.

With reference to FIGS. 5A and 6, in one embodiment, the present inventions include data sense circuitry 100 coupled to memory cell array 10. The data sense circuitry 100 includes data sense amplifier circuitry 102 which is controllable and/or selectively connected to each bit line 32 of memory cell array 10. The data sense amplifier 102 includes sense amplifier latch 104 reference current input circuitry 106, and bit line input circuitry 114.

Briefly, sense amplifier latch 104 samples, senses, reads and/or determines the data state of a memory cell disposed on row line 28 that is connected to the associated data sense amplifier 102. The reference current input circuitry 106 applies a reference current, generated by or in reference to current generation circuitry 108, and to data sense amplifier circuitry 102. In operation, data sense amplifier circuitry 102 compares the current conducted by memory cell 12 with the reference current generated by reference current generation circuitry 108 in sensing, sampling and/or determining the data of the selected memory cells 12. Typically, the magnitude of the reference current generally lies between the magnitudes of the currents conducted in the logic high data state and logic low data state of memory cell 12.

Notably, input/output circuitry 110 facilitates external access to memory cells 12 of memory cells array 10 via sense amplifier circuitry 102. In this regard, data may be stored in and/or output from a row of memory cells 12 by selectively and controllably enabling input/output circuitry 110 associated with sense amplifier circuitry 102. The input/output circuitry 110 may include pass gates and/or column switch circuitry to facilitate and/or implement the read and write operations to memory cells 12. There are many different configurations and techniques (and circuitry therefor) to implement such circuitry. All such configurations and techniques, whether now known or later developed, are intended to fall within the scope of the present inventions.

The memory cell selection circuitry 112 may control the connection of a selected row of memory cells 12 of memory cell array 10 to data sense amplifier circuitry 102. Notably, memory cell selection and control circuitry 112 may be a conventional word line and bit line decoder or driver. Moreover, control signal generation circuitry to selectively apply predetermined voltage signals to word lines 28 and source lines 30. In addition, pass gates and/or row switch circuitry (not illustrated) may be employed to selectively activate a transistor of memory cell 12 connected to data sense amplifier circuitry 102 to facilitate and/or implement the read operation of memory cell 12. There are many different control/selection techniques (and circuitry therefor) to implement the read and write operations. All such control/selection techniques and circuitry therefor, whether now known or later developed, are intended to fall within the scope of the present inventions.

Figure 5B:
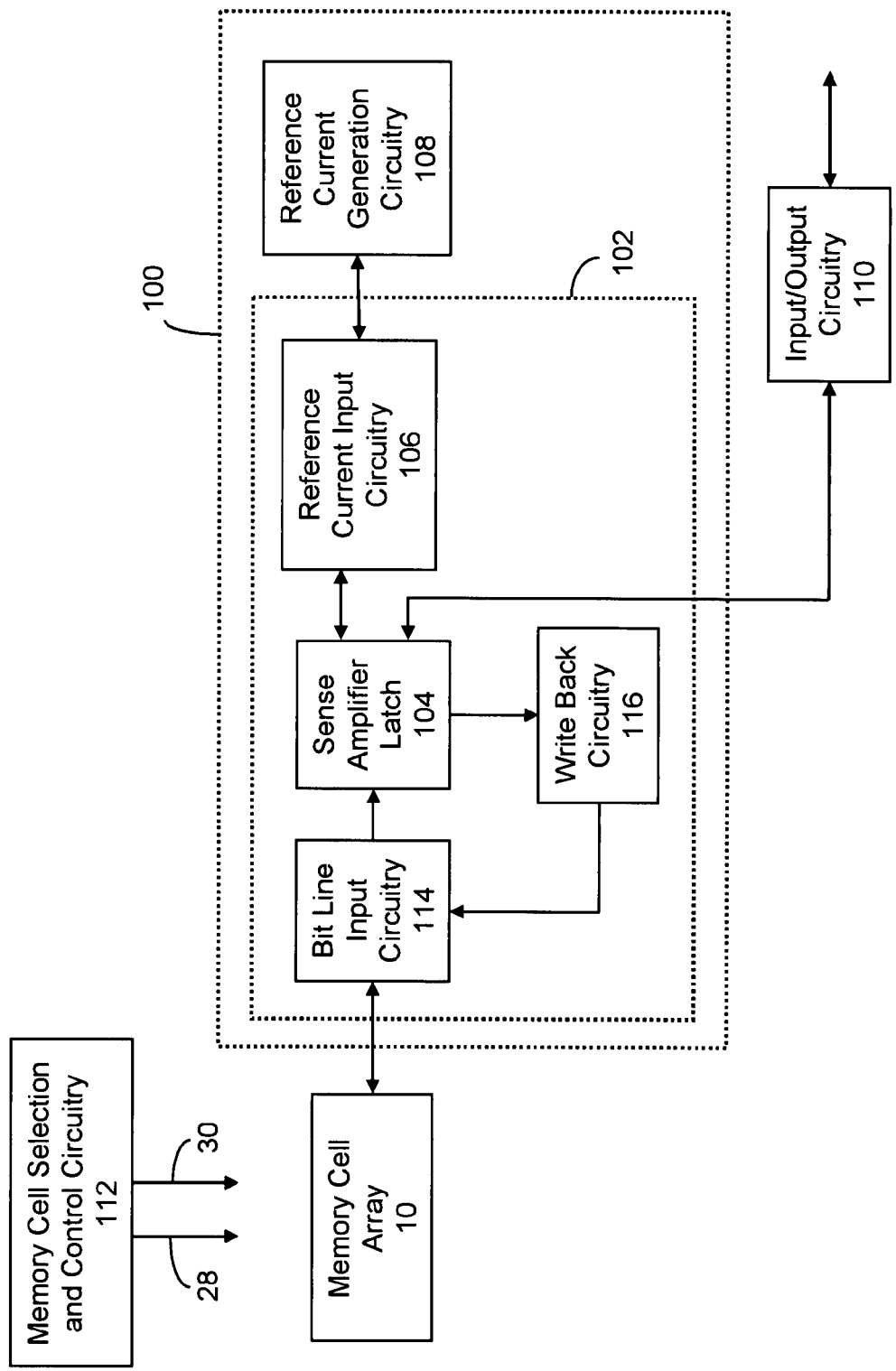

In one embodiment, with reference to FIG. 5B, data sense circuitry 100 may include write back circuitry 116 to modify or "re-store" the data read, sampled and/or sensed during a read operation or a refresh operation in the context of an array of volatile and/or destructive read type memory cells 12. As such, in this embodiment, data sense circuitry 100 restores or refreshes data in an entire row of memory cells 12 in parallel. The write back circuitry 116 will be described in more detail below.

With reference to FIGS. 5A, 6, 7 and 8, in one embodiment, data sense amplifier circuitry 102 includes sense amplifier latch 104 having input node SA, coupled to bit lines 32, via bit line input circuitry 114, and input node SAB, connected to reference current input circuitry 106. In operation, input nodes SA and SAB are equilibrated to and maintained at a source voltage (in the illustrated example, $V_{SS}$) while transistors 142, 144a and 144b are biased at a reference voltage or voltages via signal lines 146 and 148. The reference voltages on lines 146 and 148 clamp the voltages (here, the high voltage level) on bit lines 32, BLREF0 and BLREF1 respectively. The nodes 118 and 120 attain predetermined sensing voltages when a predetermined memory cell 12 is turned on (via memory cell selection and control circuitry 112 applying a predetermined read control signal on a corresponding memory cell 12). Thereafter, node 122 is released, by turning off transistors 124a and 124b (via application of control signal EQSA having suitable voltage and timing). This configuration allows a differential voltage on input nodes SA and SAB to develop based on the charging currents (or discharging currents) supplied by transistors 126 and 128. Finally, transistors 142, 144a and 144b are turned off after sense amplifier latch 104 is latches a data state.

The current supplied or provided by transistor 126 is mirrored from the selected memory cell 12. The activated memory cell 12 is connected to bit line 32, which is associated with a particular sense amplifier latch 104. The current supplied or provided by transistor 128 is mirrored from the current provided by reference current generation circuitry 108. In one embodiment, as described in detail below, the current supplied by reference current generation circuitry 108 is equal to or substantially equal to one-half of the summation of the currents in a first reference cell, which has a logic low data state, and a second reference cell, which has a logic high data state.

With reference to FIGS. 5A, 6, 7 and 8, in operation, the currents output or provided by transistors 126 and 128 charge the intrinsic capacitances of input nodes SA and SAB thereby providing or producing a differential voltage therebetween. The sense amplifier latch 104 (comprised of transistors 130-136 which are arranged in a cross-coupled configuration) amplifies the difference to provide a first voltage at one of the input nodes (SA or SAB) and the complementary voltage at the other input node. The larger of the two currents will charge the respective input node of sense amplifier latch 104 to a higher voltage level. Thus, for example, in the event that a logic high (State "1") is stored in memory cell 12 that is read, transistor 126 provides more current than transistor 128 and, as such, input node SA of sense amplifier latch 104 is amplified to the first supply potential (in the illustrated embodiment, $V_{DSA}$) and input node SAB is pulled or brought to the second supply potential (in the illustrated embodiment, $V_{SS}$).

In particular, where a memory cell having a logic high data state is being read, when or after input node SA of sense amplifier latch 104 is raised to a threshold voltage (Vt) level, transistor 134 turns on to "pull" input node SAB low, which turns transistor 130 off and turns transistor 132 on. Under these circumstances, input node SA is pulled to the first supply potential (in the illustrated embodiment, $V_{DSA}$) when transistor 138 is turned on via signal line 140. Notably, transistor 132 does not turn on until transistor 138 turns on. Moreover, signal STRSAB (on signal line 140) may be pulsed low before input node SAB is above a threshold voltage level.

Where a memory cell having a logic low data state is being read, when input node SAB of sense amplifier latch 104 is raised to a threshold voltage (Vt) level, transistor 130 turns on to "pull" input node SA low, which turns transistor 134 off and turns transistor 136 on. Notably, transistor 136 does not turn on until transistor 138 turns on. Under these circumstances and when transistor 138 is turned on via signal line 140 (STRSAB may be pulsed low before input node SAB is above a threshold voltage level), input node SAB is pulled to the first supply potential (in the illustrated embodiment, $V_{DSA}$).

For example, in the event that transistor 126 is providing a current of 10 μA and transistor 128 is providing a current of 20 μA, the voltage on input node SAB will be about twice the voltage relative to the voltage on node SA because input node SAB has twice the current to charge up the same or substantially similar node capacitances. Moreover, because transistors 126 and 128 are designed to have the same or substantially similar drain to source bias, a current mirror may be employed.

After sense amplifier latch 104 senses, samples and/or determines the data state of the selected memory cell, the data state of the selected memory cell is stored in sense amplifier latch 104 by turning off transistors 142, 144a and 144b via applying control signals, having a logic low, on signal lines 146 and 148, respectively. The data may be read or accessed from sense amplifier latch 104 via pass gates 150a and 150b of input/output circuitry 110.

Notably, the first voltage may be a first supply potential (in the illustrated embodiment, $V_{DSA}$) and the second voltage may be a second supply potential (in the illustrated embodiment, $V_{SS}$). The specific voltages of the first and second supply potentials may be determined based on programming or writing operation considerations or requirements of memory cell 12.

Figure 7:
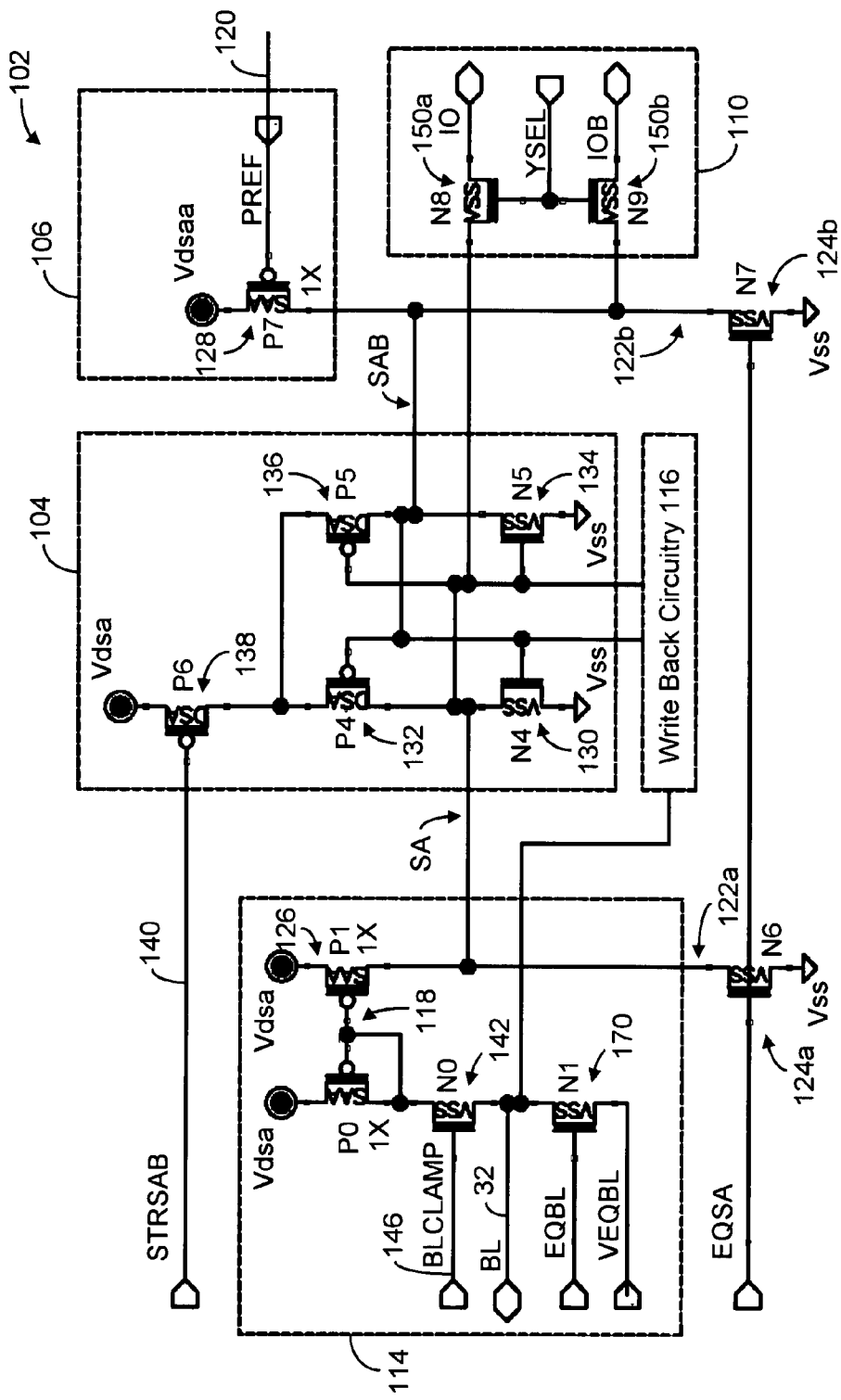
FIG. 7 is a schematic representation of a first embodiment of the data sense amplifier circuitry, including a sense amplifier latch, bit line input circuitry and write back circuitry, in conjunction with input/output circuitry, according certain aspects of the present inventions.

With reference to FIGS. 5B, 6 and 7, data sense amplifier circuitry 102 also includes write back circuitry 116 to modify or "re-store" the data read, sampled and/or sensed during a read operation or a refresh operation in the context of a DRAM memory cell array (for example, a plurality of N-channel or NMOS electrically floating body transistors). The write back circuitry 116 generates the correct bit line voltage based on the data stored in sense amplifier latch 104 to program the selected or predetermined memory cell 12 to the appropriate data state (for example, the data state that existed prior to reading the memory cell or for example, data that has been written to the sense amplifier latch using input/output circuitry 110). In the case of modifying data in memory cell array 10, for example, a row of memory cells 12 is first read, sampled and/or sensed so that bit cell data is copied to sense amplifier latches 104 of sense amplifier circuitry 100. Selected latches in sense amplifier circuitry 100 are then overwritten by the application of new data via pass gates 150a and 150b of input/output circuitry 110. Finally, data in sense amplifier latches 104 of sense amplifier circuitry 100 is written back into memory cells 12 of the selected row of memory cell array 10 by way of write back circuitry 116.

Figure 8:
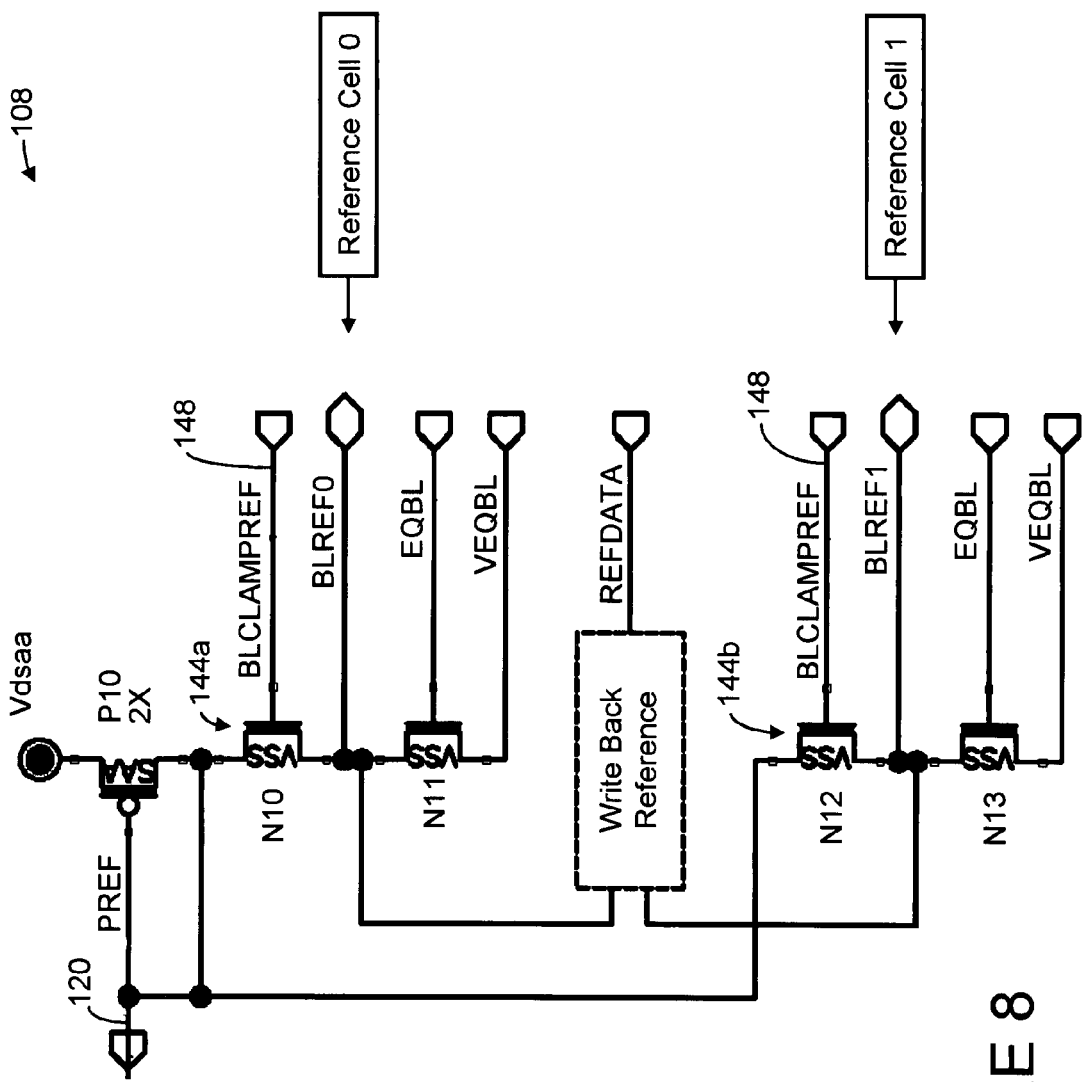
FIG. 8 is a schematic representation of reference current generation circuitry, which may be employed with the data sense amplifier circuitry of FIG. 7, in accordance with certain aspects of the present inventions.

With reference to FIG. 8, "write back reference" is that circuitry which generates the appropriate voltages for writing the reference cells. In the exemplary embodiment of FIG. 8, two memory reference cells are employed such that one memory cell stores a "0" data state and the other memory cell stores a "1" data state. In operation, if REFDATA is changed from low to high, the states of the two memory reference cells are swapped or changed to the opposite data state. This technique may enhance or improve the reliability of the memory array in that it will minimize the situation where a particular memory cell is continuously programmed with the same data state.

Figure 9A:
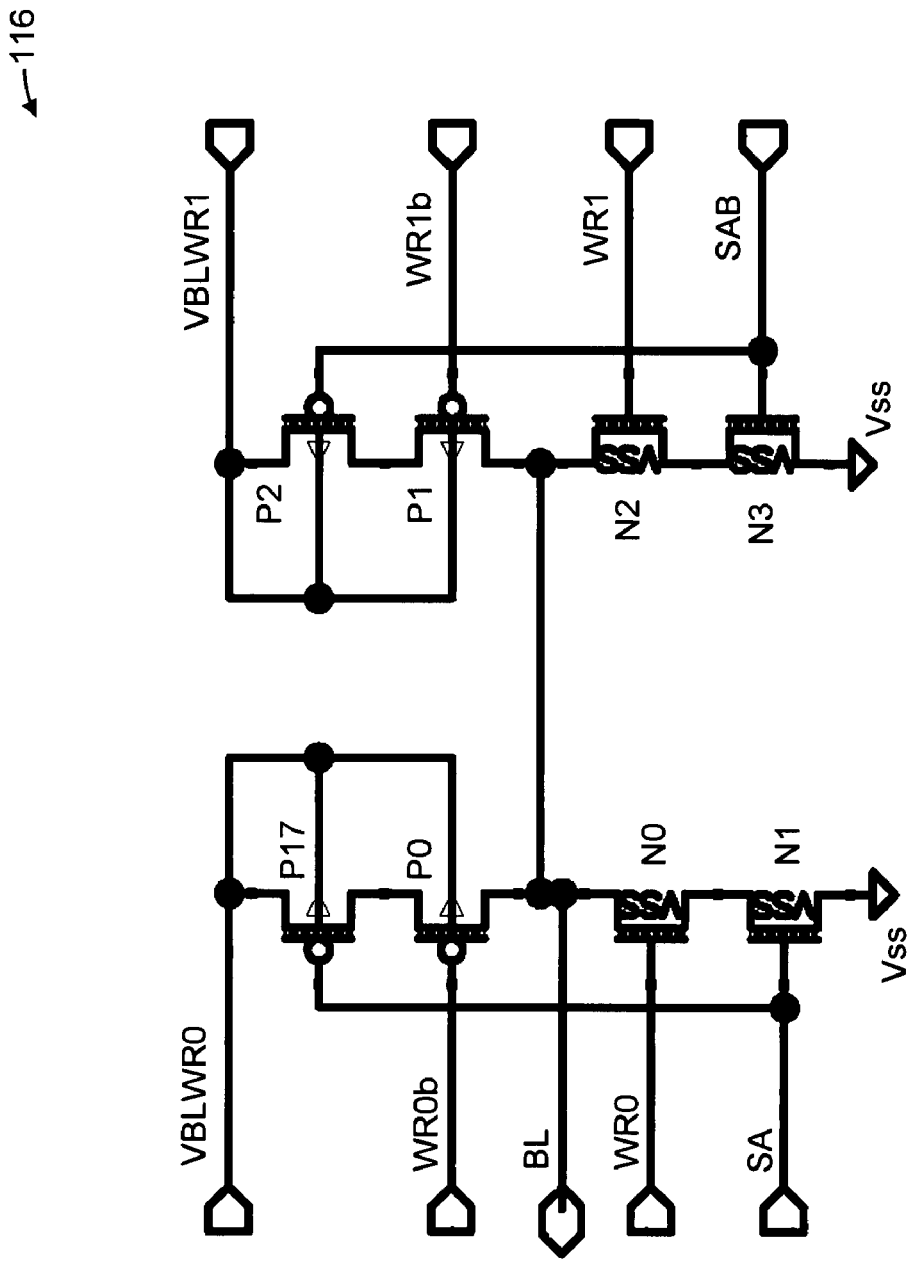
FIGS. 9A-9C are schematic representations of write back circuitry, which may be employed with the data sense amplifier circuitry of FIG. 7, in accordance with certain aspects of the present inventions.
Figure 9B:
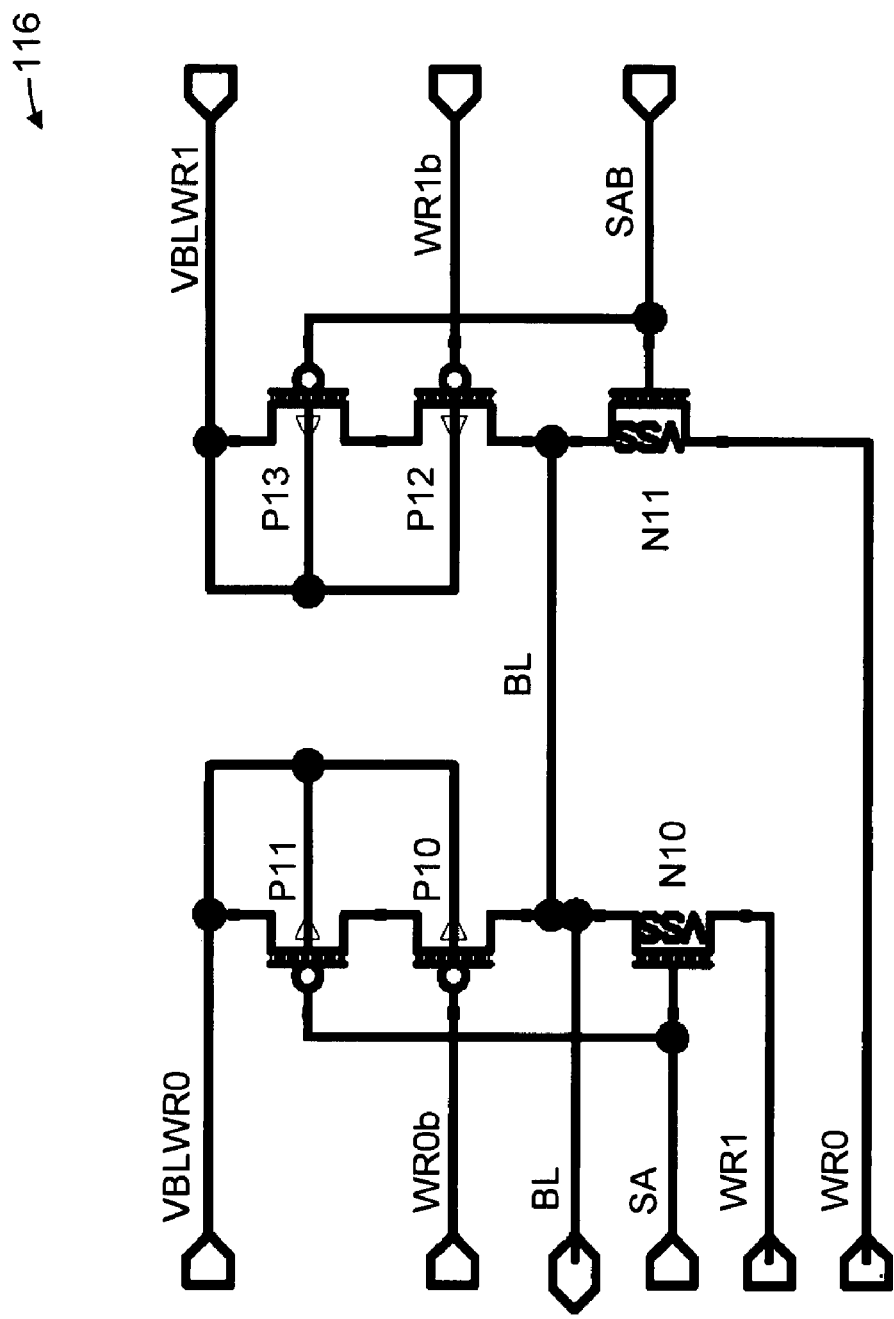
Figure 9C:
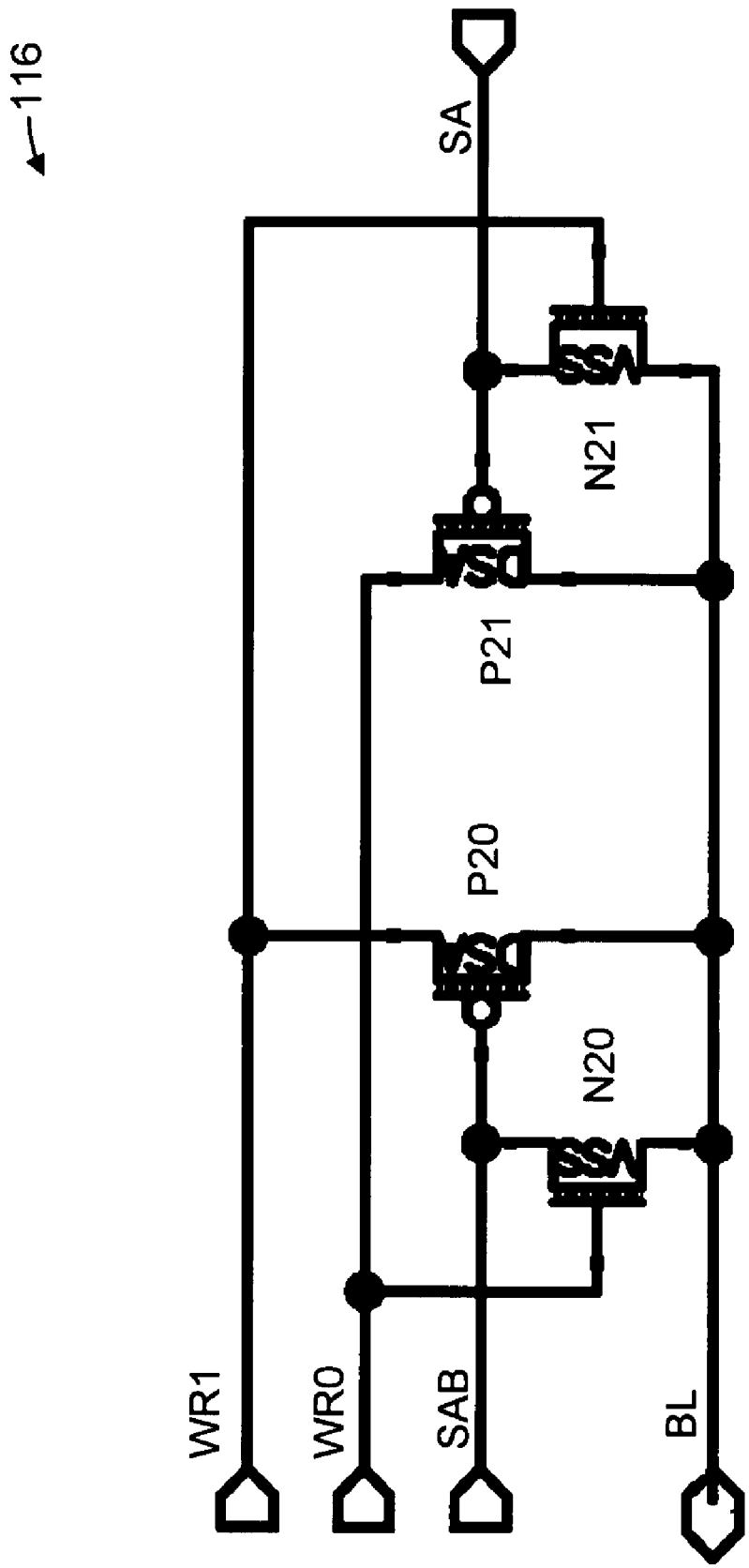

With reference to FIGS. 9A-9C, write back circuitry 116 may be configured in various embodiments (employing different numbers of transistors) that are suitable for generating the appropriate voltages for the selected memory cell technology. In all write back configurations, the complimentary outputs SA and SAB of sense amplifier latch 104 determine if the voltages appropriate to write data state "1" or the voltages appropriate to write data state "0" are applied to bit line 32. Control signals WR0, WR0b, WR1, and WR1b are global signals that connect to write back circuitry 116 for all of data sense amplifier circuitry 102. Signal WR0 is generated by inverting WR0b, and WR1 is generated by inverting WR1b.

Notably, as will be clear to one skilled in the art in view of this disclosure, write back circuitry 116 may be "customized" to generate the bit line voltages suitable to program the memory cell of the selected memory technology. In this regard, the memory technology may be an electrically floating body transistor described above or any other technology whether now known or later developed. Accordingly, all such write back circuitry, whether now known or later developed should be considered to fall within the scope of the present inventions.

With reference to FIGS. 5A, 6, 10 and 11, in another embodiment, data sense amplifier circuitry 102 is coupled to memory cell array 10 (for example, including a plurality of memory cells each having an N-channel type electrically floating body transistor). In this embodiment, data sense amplifier circuitry 102 modifies, senses, samples and/or reads the data state of a predetermined or selected memory cell via transistor 152 (in contrast to the current mirror configuration of FIG. 7). Since the current on bit line 32 tends to pull towards the second supply voltage ($V_{SS}$), data sense amplifier circuitry 102 is equilibrated to the first supply voltage ($V_{DSA}$). Thereafter, the EQSAB signal is released after node 154 reaches a sensing voltage with the selected word line 28 turned on. That is, the input nodes SA and SAB of sense amplifier latch 104 are released from the first supply voltage ($V_{DSA}$) after node 154 reaches its sensing voltage thereby permitting or allowing a differential voltage on input nodes SA and SAB of sense amplifier latch 104 to develop based on the charging currents (or discharging currents) supplied by transistor 152 (provided or produced in response to the output of the selected memory cell 12) and transistor 156 (provided or produced in response to the output of reference current generation circuitry 108).

Figure 10:
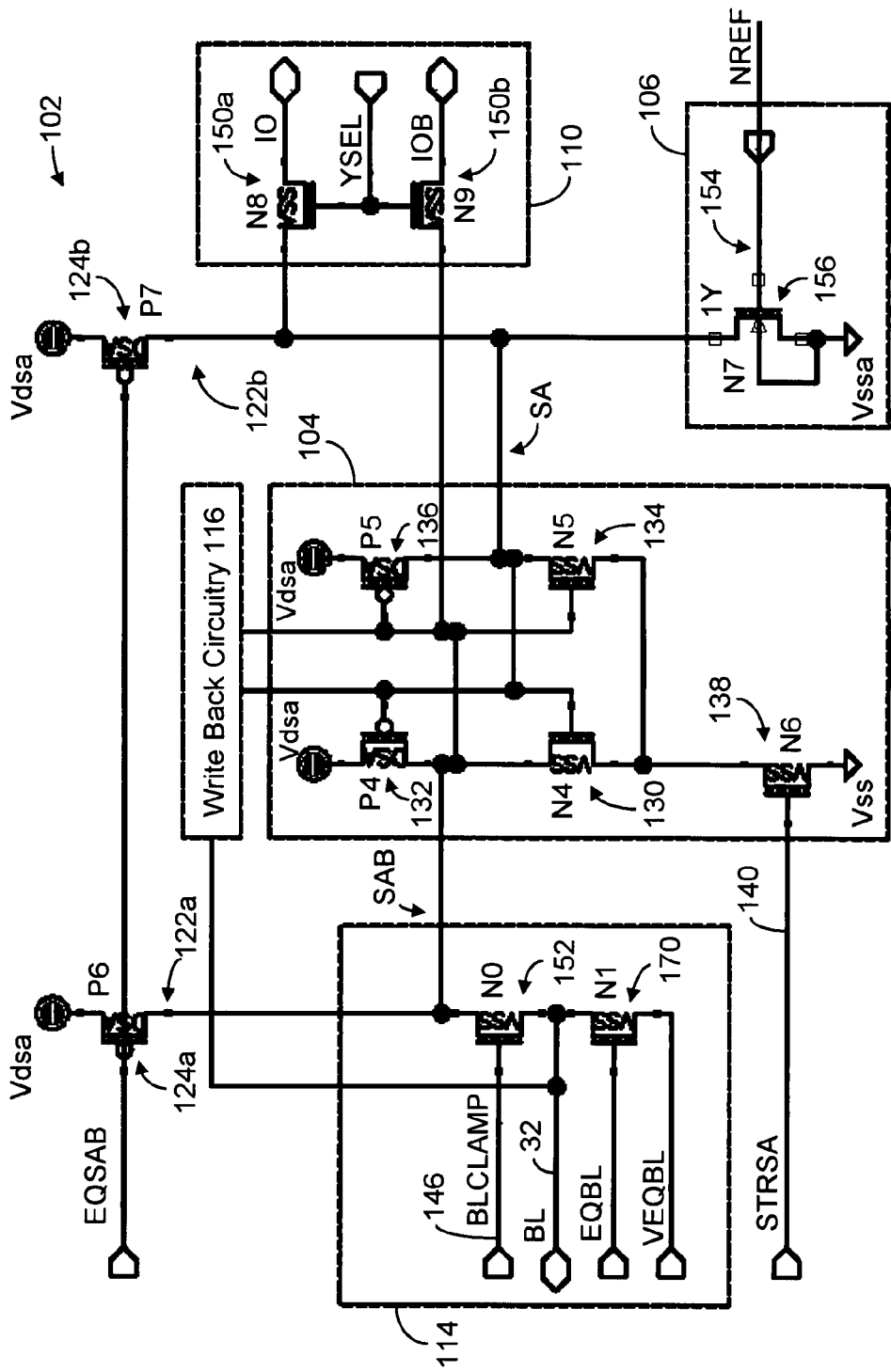
FIG. 10 is a schematic representation of another embodiment of the data sense amplifier circuitry, including a sense amplifier latch, bit line input circuitry and write back circuitry, in conjunction with input/output circuitry, according certain aspects of the present inventions.
Figure 11:
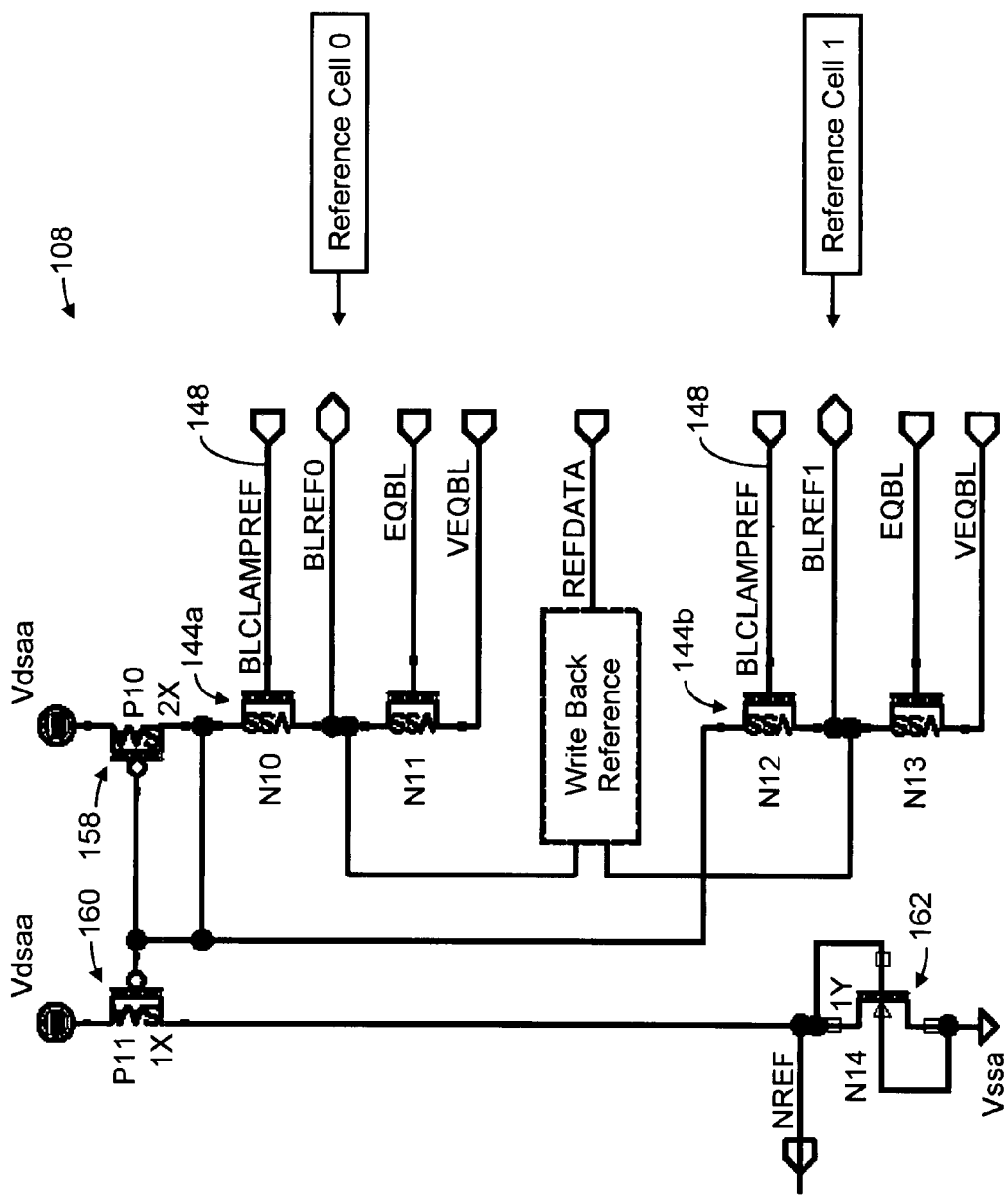
FIG. 11 is a schematic representation of reference current generation circuitry, which may be employed with the data sense amplifier circuitry of FIG. 10, in accordance with certain aspects of the present inventions.

With reference to FIGS. 10 and 11, the current generated or provided by transistor 156 is current mirrored from the current supplied by reference current generation circuitry 108 (via transistors 158-162), which is half of the summation of the currents in the two reference cells. As mentioned above, in one embodiment, the current supplied by reference current generation circuitry 108 is substantially equal to one-half of the summation of the currents in a first reference cell, which has a logic low data state, and a second reference cell, which has a logic high data state.

In the operation of this embodiment, the currents provided by transistors 152 and 156 discharge the intrinsic capacitances of input nodes SA and SAB thereby providing or producing a differential voltage between the two input nodes of sense amplifier latch 104. The greater of the two currents will discharge its corresponding input node further and faster from the first supply voltage (illustrated in this exemplary embodiment as $V_{DSA}$) than the other input node. As such, in the event that input node SA of sense amplifier latch 104 is the first node to fall a threshold voltage (Vt) level below first supply voltage, transistor 132 turns on and thereby pulls the voltage of input node SAB to the first supply voltage. Where, however, input node SAB is the first node to fall a threshold voltage (Vt) level below first supply voltage, transistor 136 turns on and thereby pulls the voltage of input node SA to the first supply voltage.

Under these circumstances and when transistor 138 is turned on via signal line 140 (STRSA may be pulsed high before input nodes SA or SAB is below the threshold voltage level), transistors 130 or 134 (as the case may be) will amplify the voltage differential between input nodes SA and SAB. Thereafter, sense amplifier latch 104 stores the data state of the selected memory cell therein by turning off transistors 152, 144a and 144b via applying control signals, having a logic low, on signal lines 146 and 148, respectively. The data may be read or accessed from sense amplifier latch 104 via pass gates 150a and 150b of input/output circuitry 110.

In another aspect, the present inventions are directed to a technique of, and circuitry for modifying, sampling, sensing, reading and/or determining the data state of a memory cell implementing two transistors which store complementary data states. That is, the two-transistor memory cell includes a first transistor that maintains a complementary state relative to the second transistor. As such, when programmed, one of the transistors of the memory cell stores a logic low (a binary "0") and the other transistor of the memory cell stores a logic high (a binary "1").

In this embodiment, the data state of the two-transistor complementary memory cell is read and/or determined by sampling, sensing measuring and/or detecting the polarity of the logic states stored in each transistor of complementary memory cell. That is, the two-transistor complementary memory cell is read by sampling, sensing, measuring and/or detecting the difference in current output by the two transistors. The two-transistor complementary memory cell is described and illustrated in U.S. patent application Ser. No. 10/829,877, which was filed by Ferrant et al. on Apr. 22, 2004, and entitled "Semiconductor Memory Cell, Array, Architecture and Device, and Method of Operating Same". For the sake of brevity, those discussions will not be repeated here; rather, the entire contents of the non-provisional U.S. patent application, including, for example, the inventions, features, attributes, architectures, layouts, configurations, materials, techniques and advantages described and illustrated therein, are hereby incorporated by reference herein.

Figure 12A:
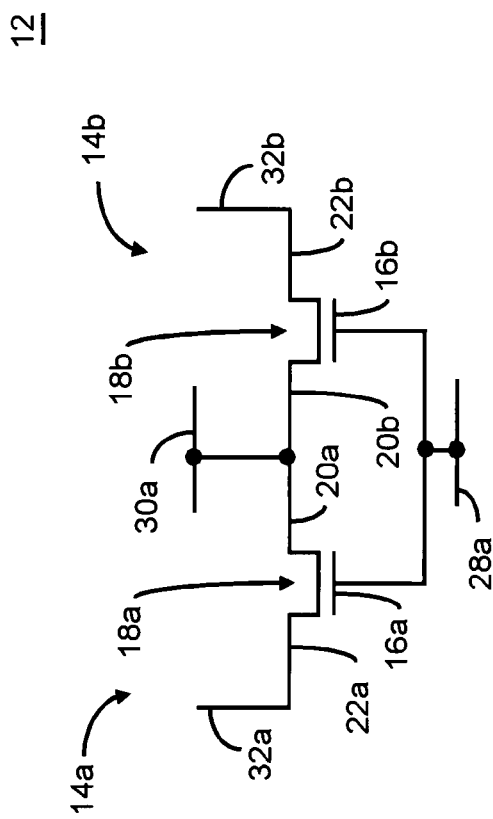
FIGS. 12A and 12B are illustrative examples of two-transistor memory cells.
Figure 12B:
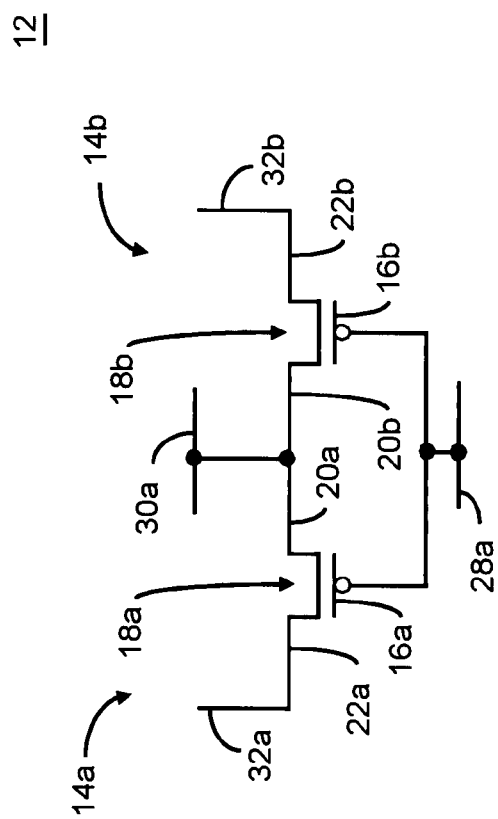
Figure 13:
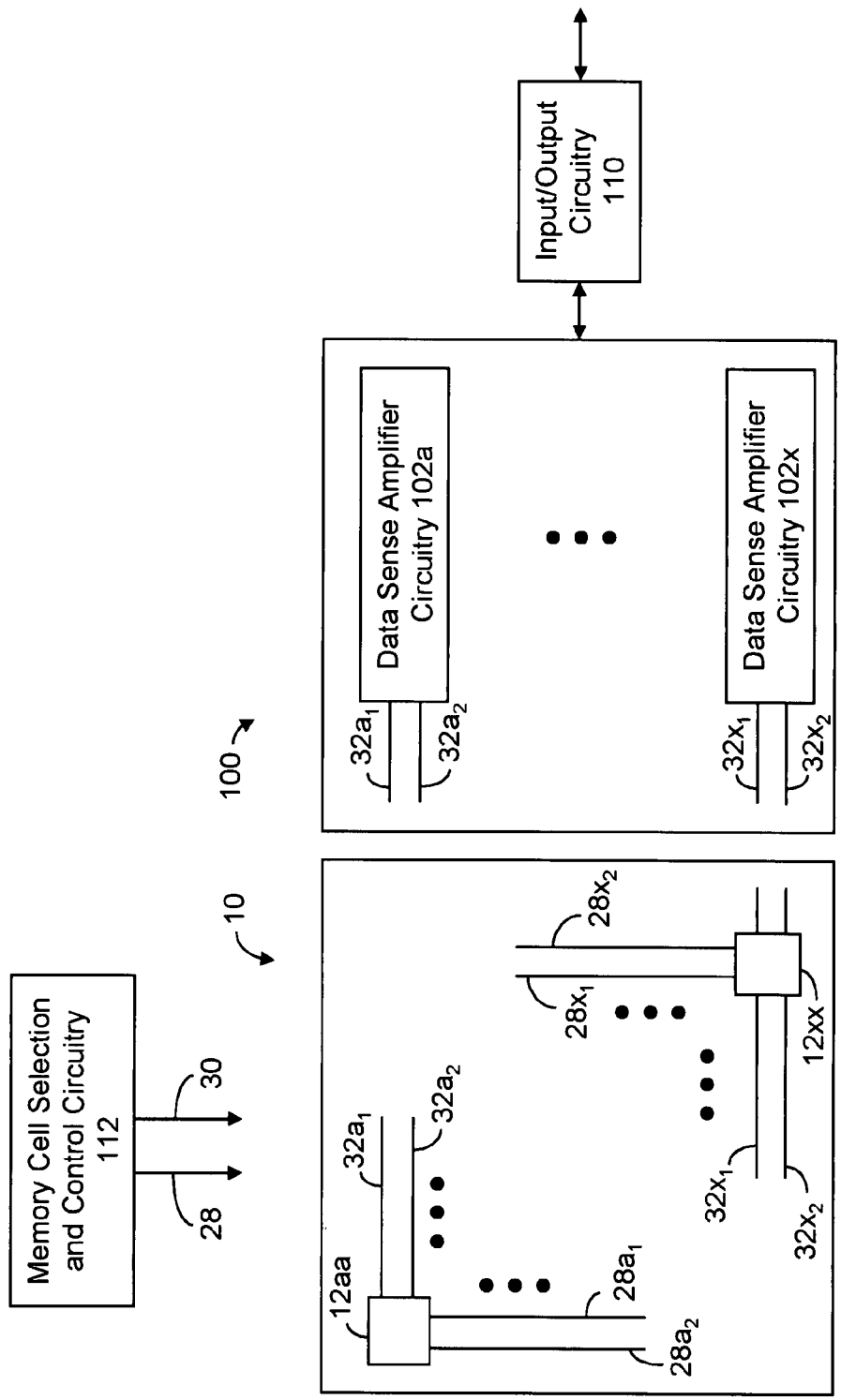
FIG. 13 is a block diagram representation of a first embodiment of a memory cell array, including a plurality of two-transistor memory cells (for example, the memory cell illustrated in FIG. 12A) in conjunction with data sense circuitry according to an embodiment of the present inventions.
Figure 14:
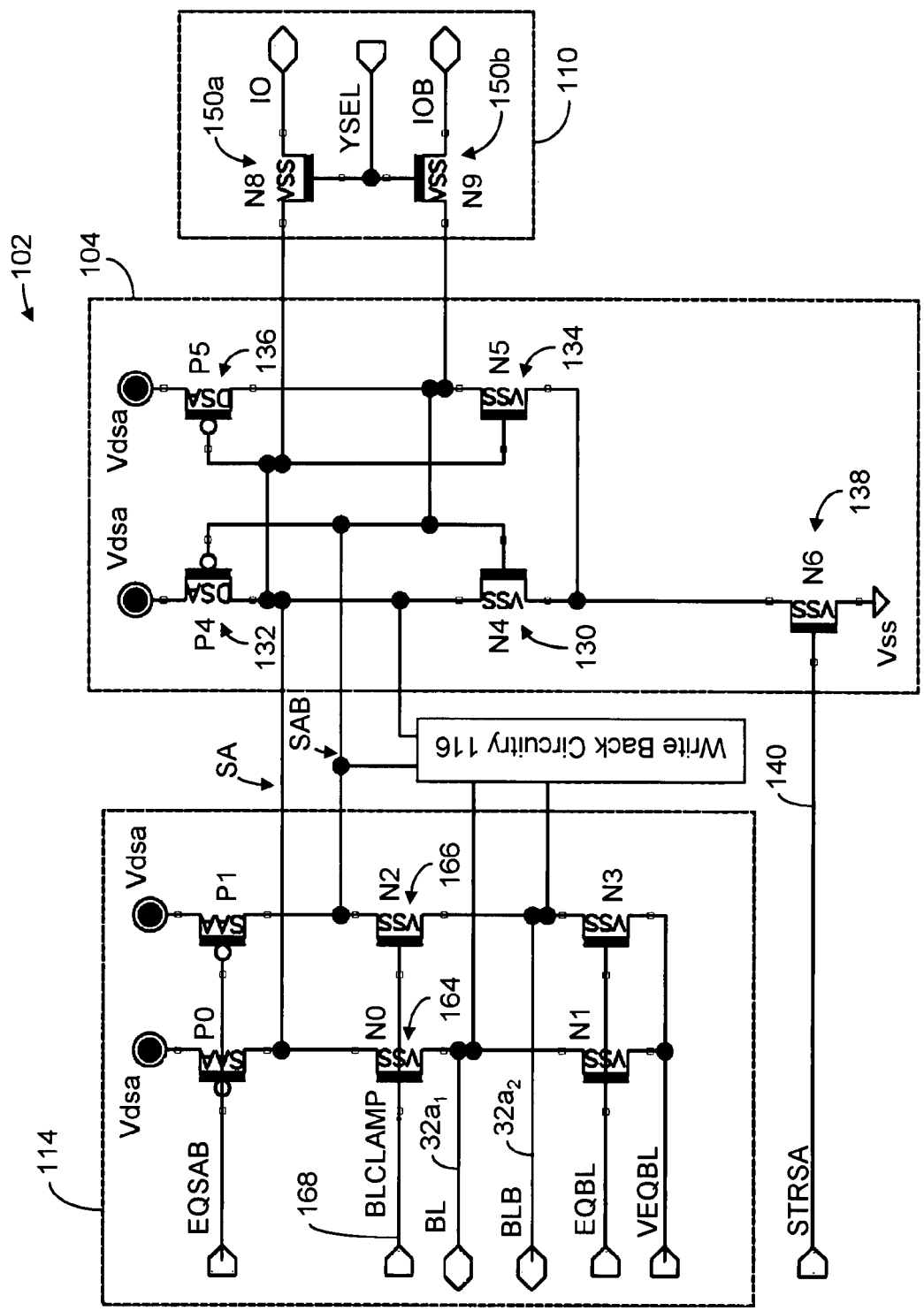
FIG. 14 is a schematic representation of a first embodiment of a data sense amplifier circuitry that may be implemented in conjunction with a two-transistor memory cell array, according certain aspects of the present inventions.

With reference to FIGS. 12, 13 and 14, in this embodiment, data sense amplifier circuitry 102 is controllable and/or selectively connected to an associated pair of two-transistor memory cells 12 of array 10 (wherein the memory transistors are NMOS transistors). In this embodiment, however, data sense circuitry 100 does not include reference current input circuitry 106 and reference current generation circuitry 108. Rather, data sense amplifier 102 receives two inputs/outputs (for example, bit lines $32a_1$ and $32a_2$) of two-transistor memory cells 12. As such, a first input/output of two-transistor memory cells 12 is provided to input node SA of sense amplifier latch 104 (via transistor 164) and a second input/output of two-transistor memory cells 12 is provided to input node SAB of sense amplifier latch 104 (via transistor 166).

In operation, the currents provided by transistors 164 and 166 (which are responsive to the data state of the transistors of two-transistor memory cells 12) discharge the intrinsic capacitances of input nodes SA and SAB, previously precharged at $V_{DSA}$ potential by transistors P0 and P1, thereby providing or producing a differential voltage therebetween. The sense amplifier latch 104 (comprised of transistors 130-136 which are arranged in a cross-coupled configuration) amplifies the difference to provide a first voltage at one of the input nodes (SA or SAB) and the complementary voltage at the other input node. The larger of the two currents will discharge the respective input node of sense amplifier latch 104 to a lower voltage level. Thus, for example, in the event that a logic high (State "1") is stored in the transistor connected to bit line $32a_1$ and a logic low (State "0") is stored in the transistor connected to bit line $32a_2$, transistor 164 provides more current than transistor 166 and, as such, input node SA of sense amplifier latch 104 is amplified to the first source potential (in the illustrated embodiment, $V_{SS}$) and input node SAB is pulled or brought to the second source potential (in the illustrated embodiment, $V_{DSA}$). Thus, the larger of the two currents will "pull" its respective input node to a lower voltage since, in the exemplary embodiment, sense amplifier latch 104 is equilibrated to a voltage of $V_{DSA}$.

The operation of sense amplifier latch 104 is substantially similar to the operation of sense amplifier latch 104 described above with respect to FIG. 10. That is, after sense amplifier latch 104 senses, samples and/or determines the data state of the selected memory cell, that data state is stored in sense amplifier latch 104 by turning off transistors 164 and 166 via applying control signal (BLCLAMP) on signal line 168. The data may be read or accessed from sense amplifier latch 104 via pass gates 150*a* and 150*b* of input/output circuitry 110 (via signal YSEL).

Figure 15A:
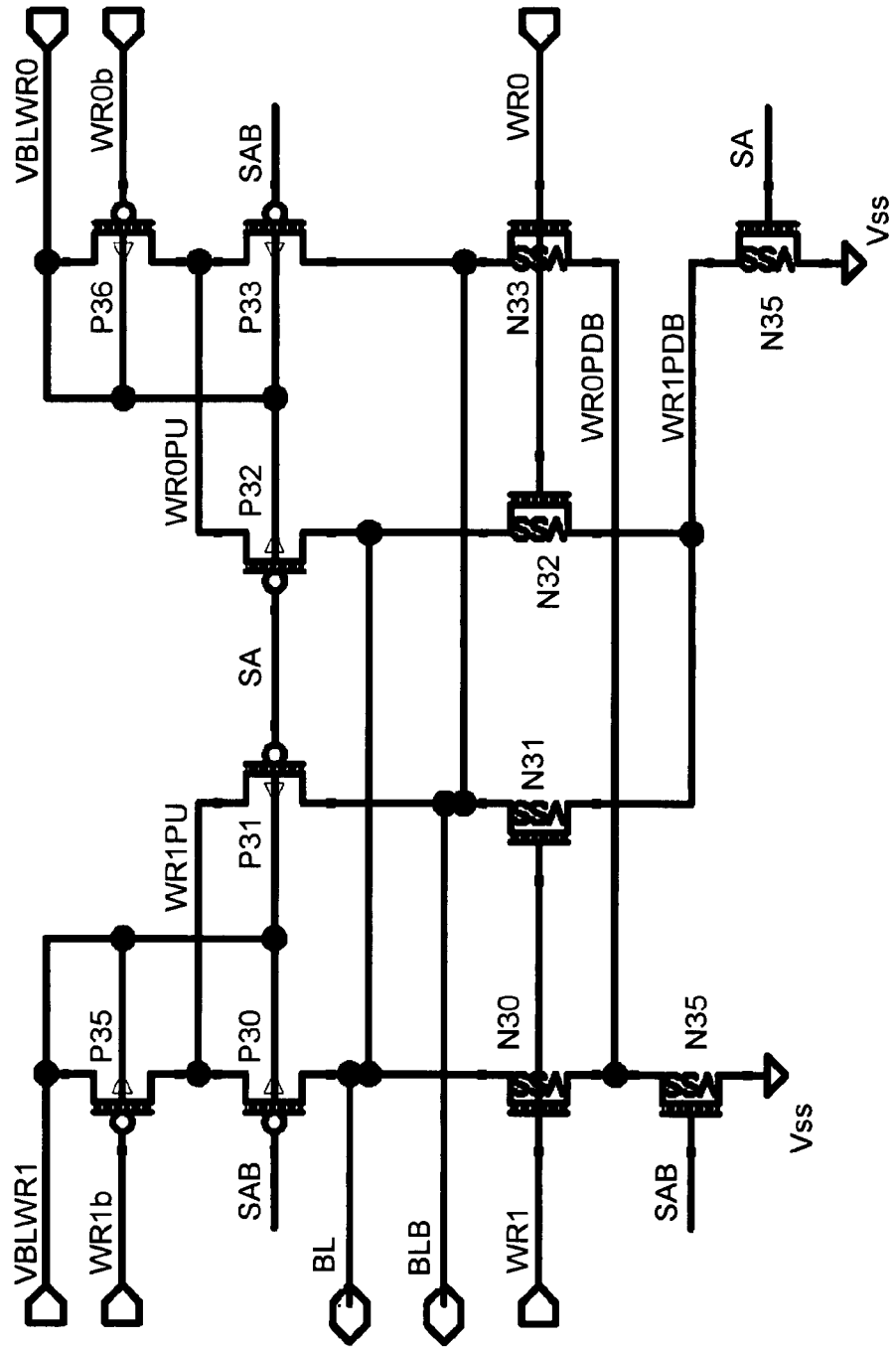
FIGS. 15A and 15B are schematic representations of write back circuitry, which may be employed with the data sense amplifier circuitry of FIG. 14, in accordance with certain aspects of the present inventions.
Figure 15B:
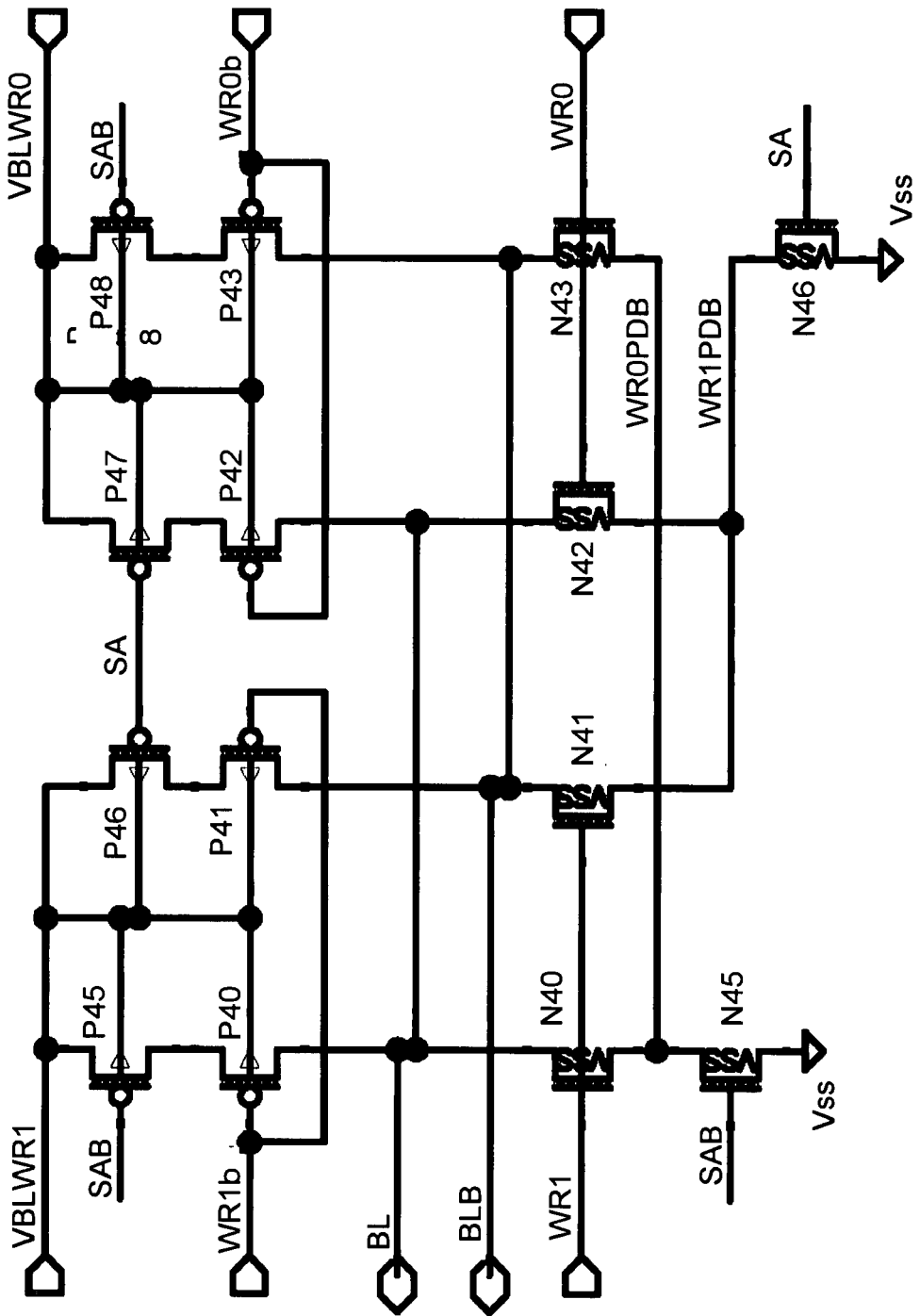

Notably, in this embodiment, write back circuitry 116 uses the data state stored in sense amplifier latch 104 to select the appropriate bit line voltages to program the two-transistors 14*a* and 14*b* of selected memory cell 12 connected to a bit line pair. A detailed schematic illustration of suitable write back circuitry 116 is illustrated in FIGS. 15A and 15B. Because the bit line currents tend to pull toward the second source voltage (illustrated in this example as $V_{SS}$), it may be advantageous to equilibrate sense amplifier latch 104 to the first source voltage (illustrated in this example as $V_{DSA}$).

Figure 16:
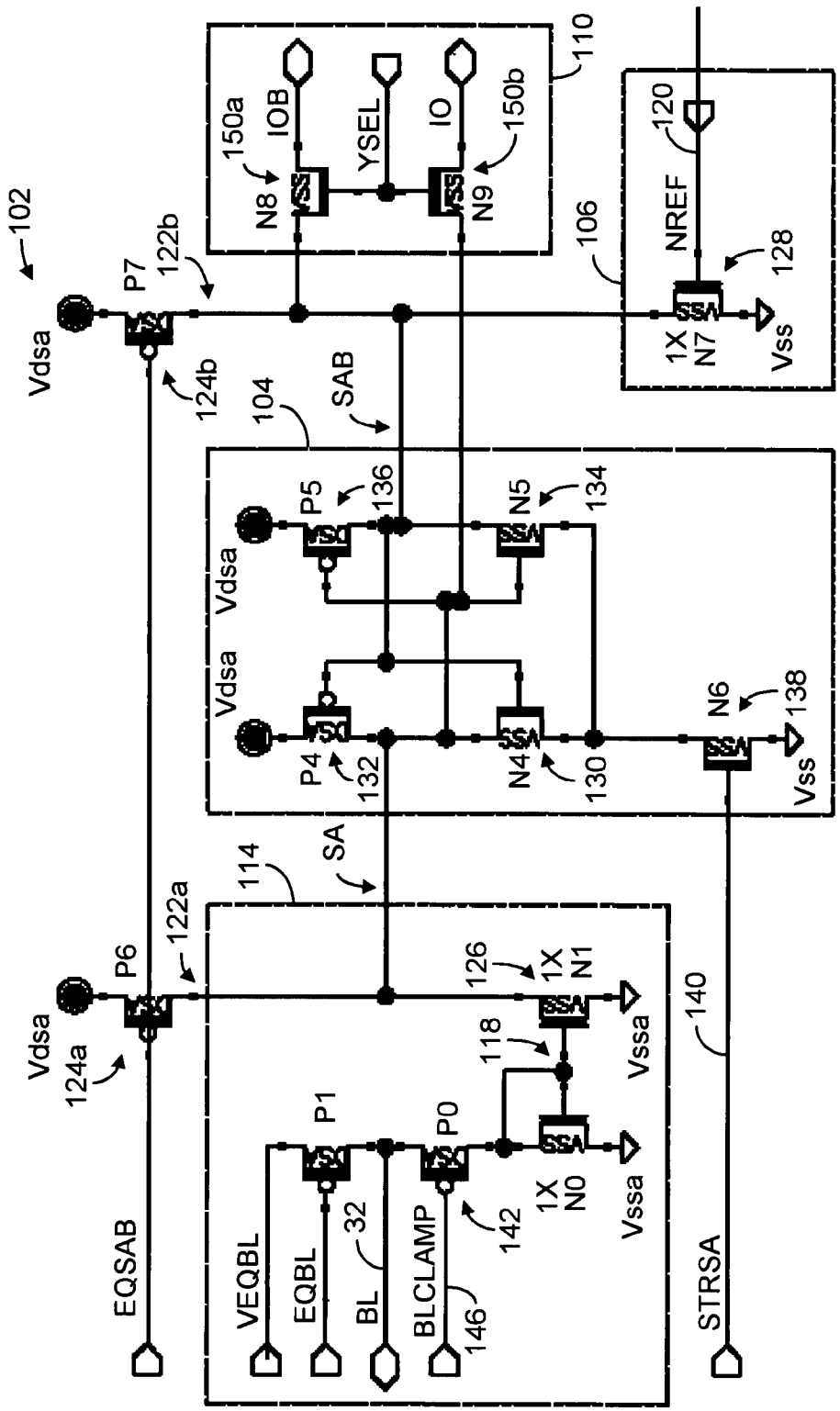
FIG. 16 is a schematic representation of a first embodiment of the data sense amplifier circuitry, including a sense amplifier latch and bit line input circuitry (but not write back circuitry), that may be implemented in conjunction with a memory cell array including a plurality of memory cells, each having a PMOS or P-channel type transistor, like that illustrated in FIGS. 1A-3B, according certain aspects of the present inventions.
Figure 17:
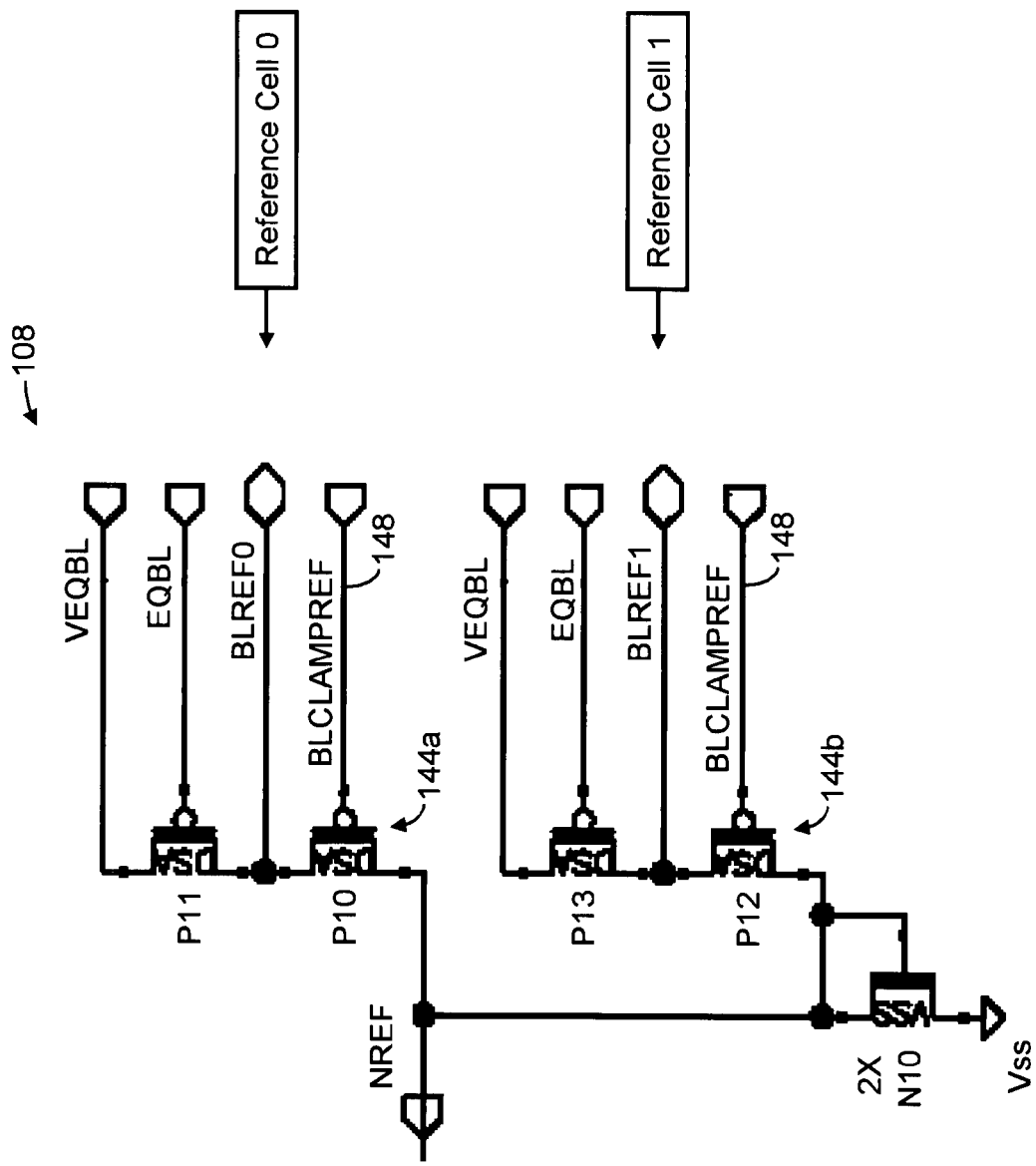
FIG. 17 is a schematic representation of reference current generation circuitry (not including write back circuitry), which may be employed with the data sense amplifier circuitry of FIG. 16, in accordance with certain aspects of the present inventions.

The present inventions may also be implemented in conjunction with a PMOS or P-channel memory array. In this regard, where PMOS or P-channel type transistors are employed as memory cells 12 in memory array 10, data sense circuitry 100 may adopt similar architectures and/or configurations of as described above with respect to NMOS or N-channel memory arrays. For example, in those circumstances where memory cell array 10 includes memory cells 12 which are each comprised of an electrically floating body PMOS or P-channel transistor 14, data sense circuitry 100 may be configured as illustrated in FIGS. 16 and 17. The operation of data sense circuitry 100 of FIGS. 16 and 17 (including data sense amplifier circuitry 102, reference current generation circuitry 108 and write back circuitry 116) is apparent to one skilled in the art, in light of this disclosure, and is similar to the operation of data sense circuitry 100 illustrated in FIGS. 7, 8 and 10. Accordingly, for sake of brevity, those discussions will not be repeated.

Figure 18:
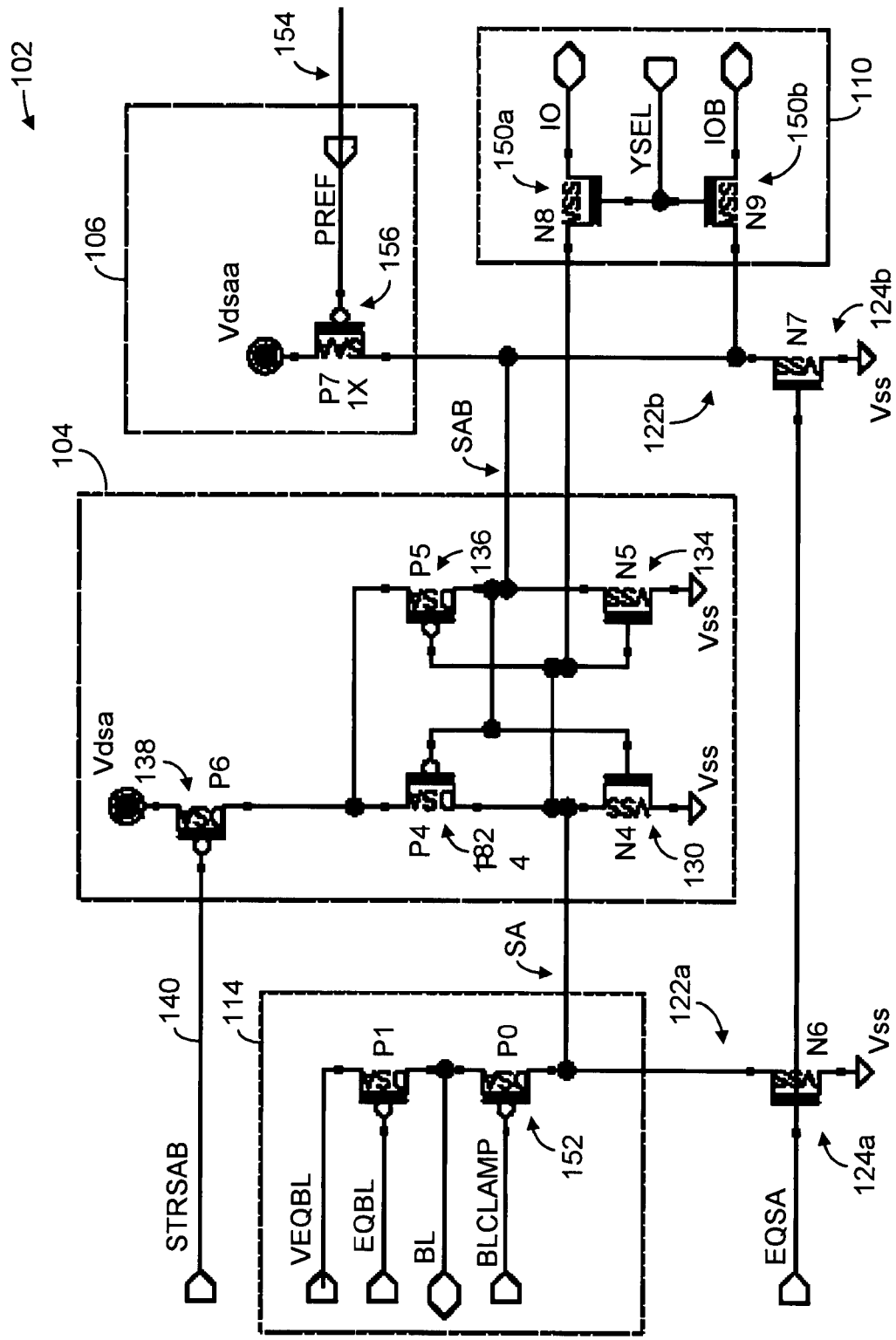
FIG. 18 is a schematic representation of another embodiment of the data sense amplifier circuitry, including a sense amplifier latch, bit line input circuitry and write back circuitry, that may be implemented in conjunction with a memory cell array including a plurality of memory cells, each having a PMOS or P-channel type transistor of the type illustrated in FIGS. 1A-3B (electrically floating body transistors), according to certain aspects of the present inventions.
Figure 19:
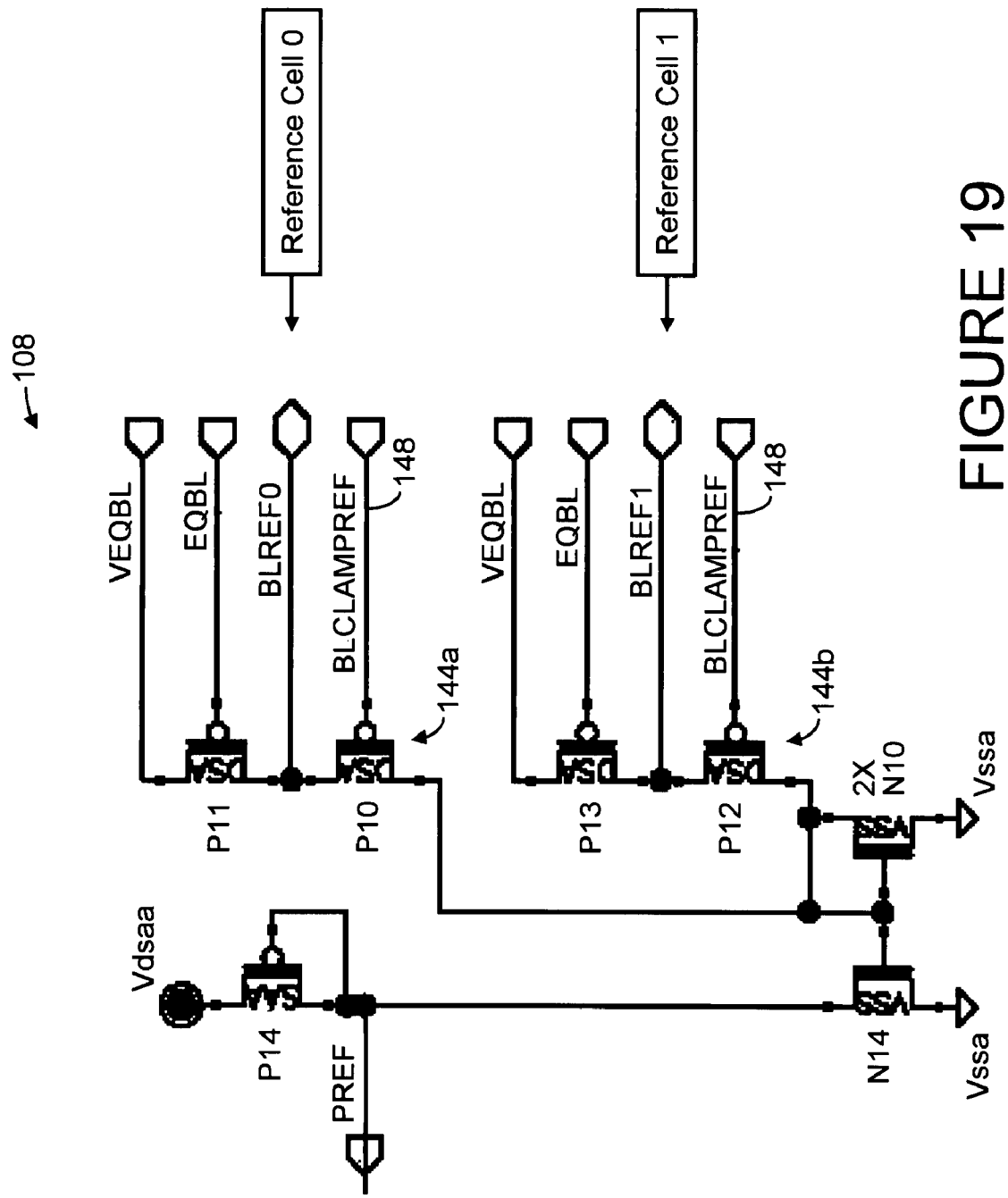
FIG. 19 is a schematic representation of reference current generation circuitry (excluding write back circuitry), which may be employed with the data sense amplifier circuitry of FIG. 16, in accordance with certain aspects of the present inventions.

In addition, in those instances where electrically floating body PMOS or P-channel transistors 14 populate the memory array 10, data sense circuitry 100 may be configured as illustrated in FIGS. 18 and 19. The operation of data sense circuitry 100 of FIGS. 18 and 19, including the operation of data sense amplifier circuitry 102 and reference current generation circuitry 108, is apparent to one skilled in the art, in light of this disclosure, and is similar to the operation of data sense circuitry 100 illustrated in FIGS. 7, 10 and 11. Again, for sake of brevity, those discussions will not be repeated.

Figure 20:
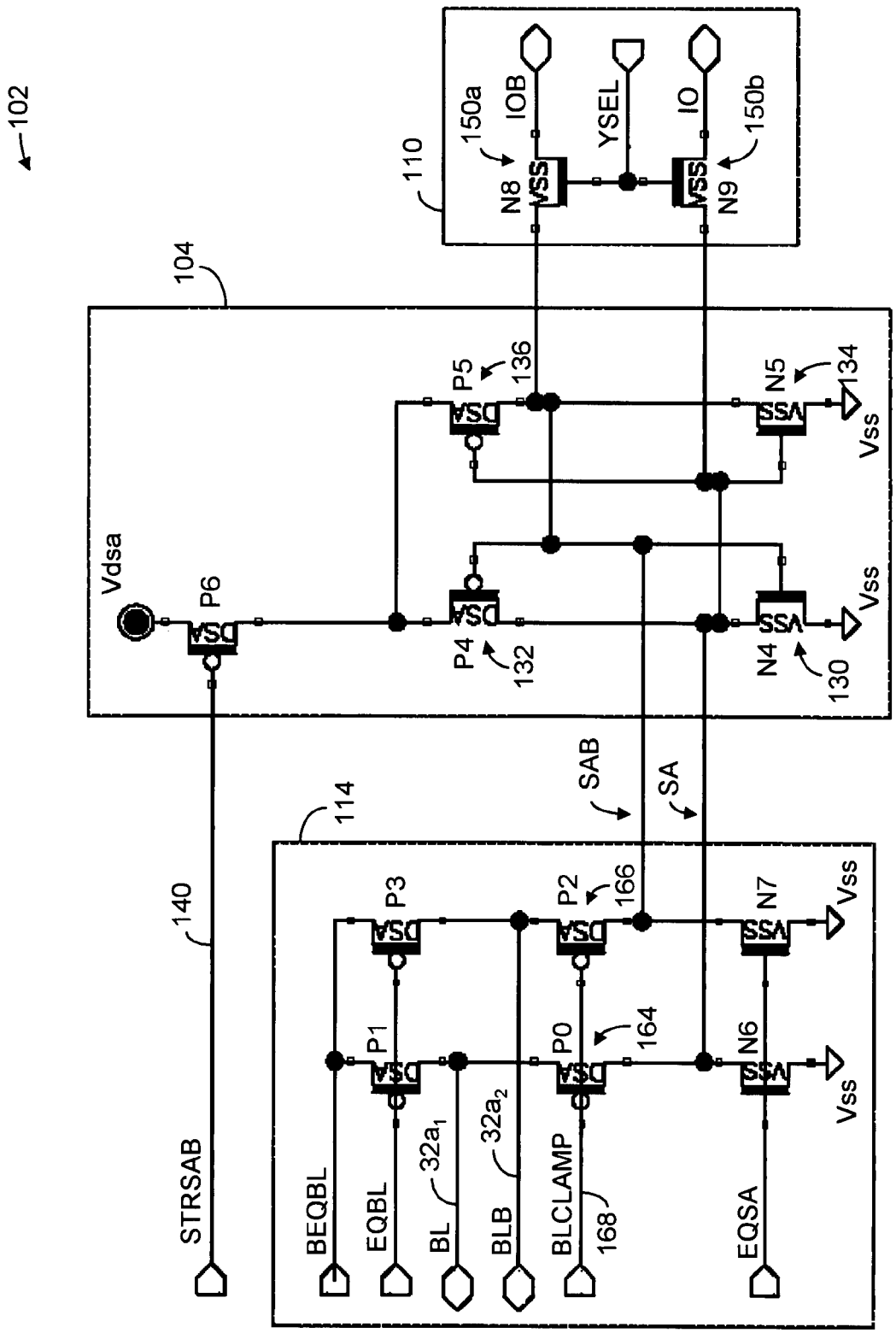
FIG. 20 is a schematic representation of data sense amplifier circuitry, including a sense amplifier latch that may be implemented with a memory cell array, having a plurality of two-transistor P-channel type or PMOS memory cells (for example, the memory cell illustrated in FIG. 12B), according certain aspects of the present inventions.

Further, where two-transistor memory cell 12 includes PMOS or P-channel transistors 14*a* and 14*b* (see, for example, FIG. 12B), data sense circuitry 100 may be configured as illustrated in FIG. 20. The operation of data sense circuitry 100 of FIG. 20 is apparent to one skilled in the art, in light of this disclosure, and is similar to the operation of data sense circuitry 100 illustrated in FIG. 14. Again, for sake of brevity, those discussions will not be repeated.

Notably, although the schematics of FIGS. 16-20 do not illustrate write back circuit 116, it is apparent to one skilled in the art that data sense amplifier circuitry 102 may include write back circuitry 116 to modify or "re-store" the data read, sampled and/or sensed during a read operation or a refresh operation in the context of a DRAM array. As such, sense amplifier circuitry 102 would modify or re-store or refresh data in an entire row of volatile and/or destructive read type memory cells in parallel which, relative to an architecture employing multiplexer circuitry, may minimize enhance and/or improve write back and read latency parameters.

The reference current generation circuitry 108 illustrated herein is connected and provides a reference current to sense amplifier latch 104 of a plurality of data sense amplifier circuitry 102. (See, for example, FIG. 6). Moreover, reference current generation circuitry 108 employs signal BLCLAMPREF to facilitate margin testing of data sense amplifier circuitry 102. In this regard, margin testing may be performed by clamping the reference bit lines at either higher or lower voltages than in normal operating conditions. For example, memory cell 12 may be read, sampled and/or sensed during a read operation or a refresh operation with BLCLAMPREF at a different voltage than BLCLAMP when these two signals are at their reference values.

Figure 21:
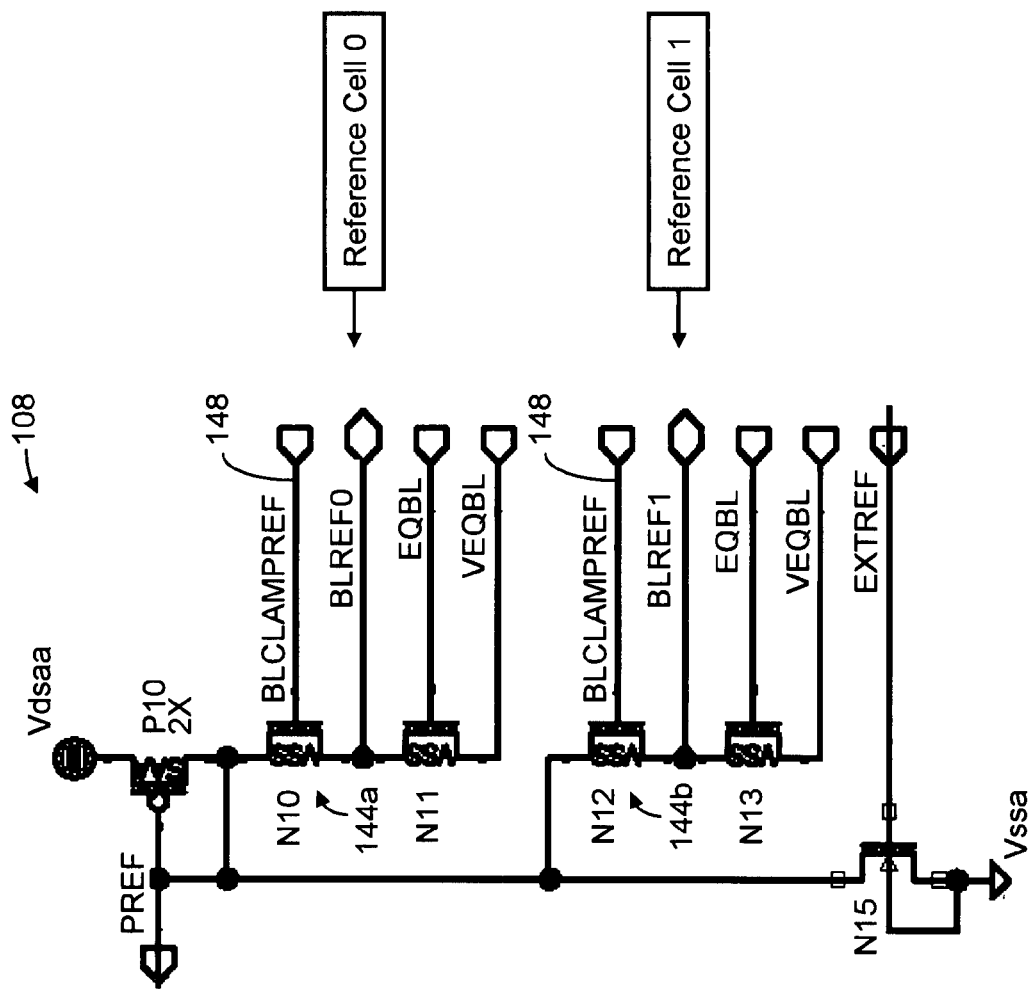
FIG. 21 is a schematic representation of reference current generation circuitry (excluding write back circuitry), having a configuration that facilitates testing of certain circuitry of data sense amplifier circuitry, in accordance with certain aspects of the present inventions.

In addition, with reference to FIG. 21, an external reference current input may be added to further facilitate testing. In this regard, test mode allows all of the reference currents to be set by an external pin to permit testing of some or all of the circuitry of data sense amplifier circuitry 102.

Notably, transistor 170 of bit line input circuitry 114 (see, for example, FIGS. 7 and 10) may be used to short bit line 32 to a VEQBL voltage—thereby facilitating testing. In normal operation, VEQBL is 0V when a particular word line 18 is unselected (i.e., off) and about 300 mV when word line is selected (i.e., on). In this way, the access time may be improved because the amount of time required for nodes 118 and PREF to attain appropriate sensing voltages may be shortened by having VEQBL at 300 mV during a read operation or a refresh operation. In another embodiment, VEQBL remains at, for example, 300 mV and transistor 170 is only turned on during a read operation or a refresh operation.

Notably, in the exemplary embodiment, BLCLAMPREF is driven low for EXTREF to set the PREF current.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, and illustrations. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present inventions.

As mentioned above, the present inventions may be implemented in conjunction with any memory technology that generates at least two current values (representative of, for example, a respective data state). In this regard, the memory technology may be an electrically floating body transistor described above or any other technology whether now known or later developed. All such memory technologies are considered to fall within the scope of the present inventions.

Figure 22A:
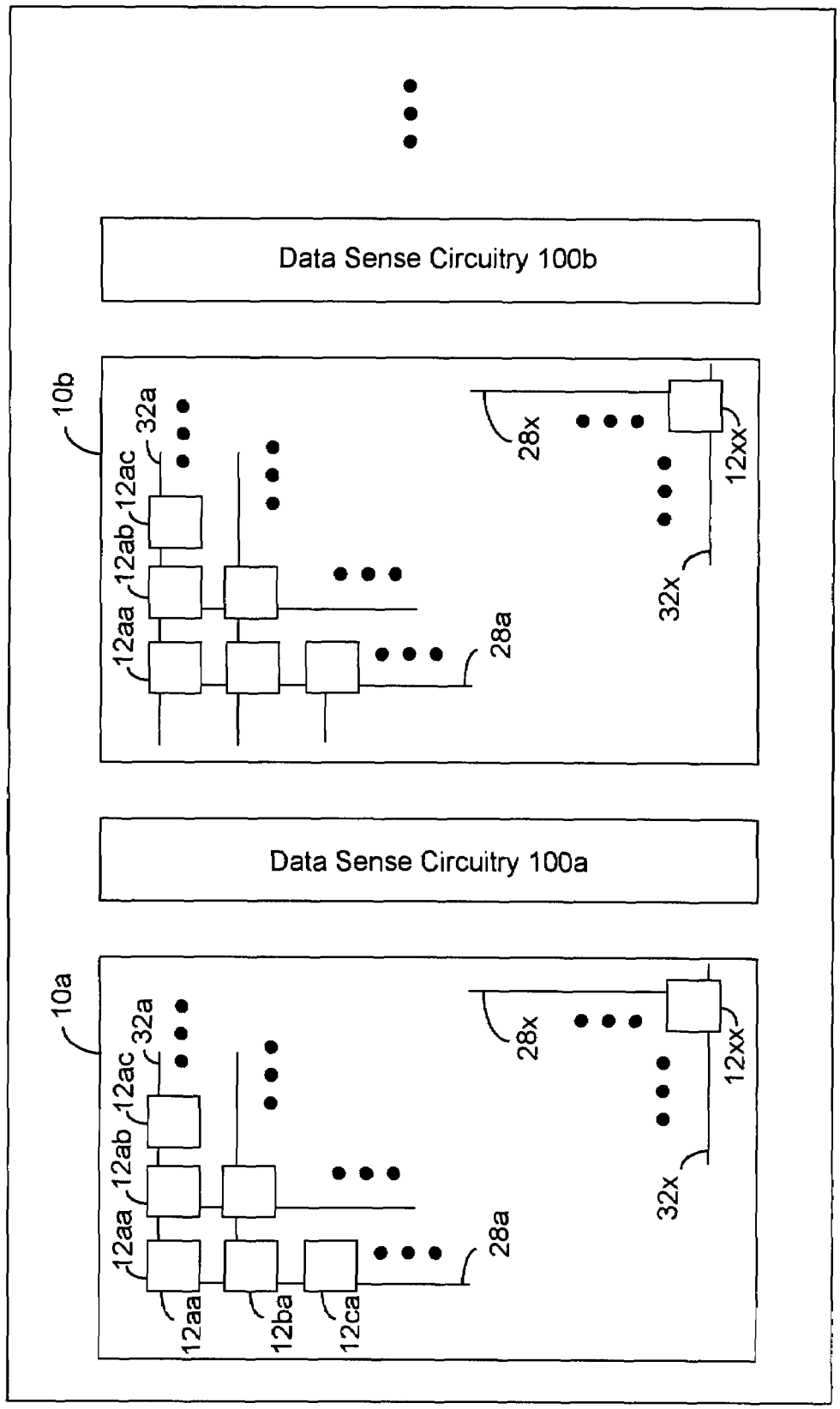
FIGS. 22A, 22B and 23 are schematic representations of memory cell array(s), including a plurality of memory cells (for example, the memory cells illustrated in FIGS. 1A-3B) in conjunction with data sense circuitry, according to various embodiments of the present inventions.
Figure 22B:
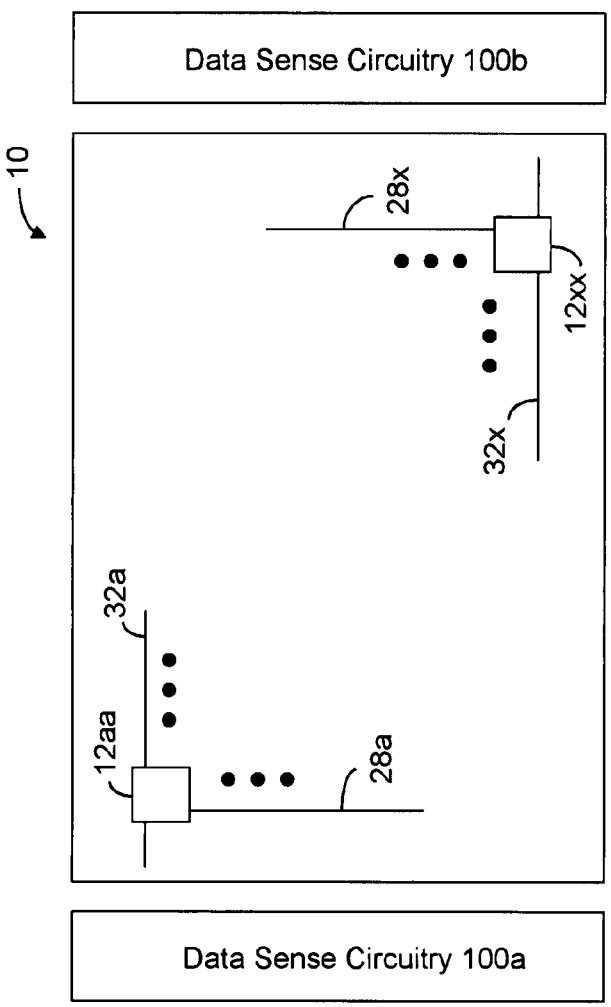
Figure 23:
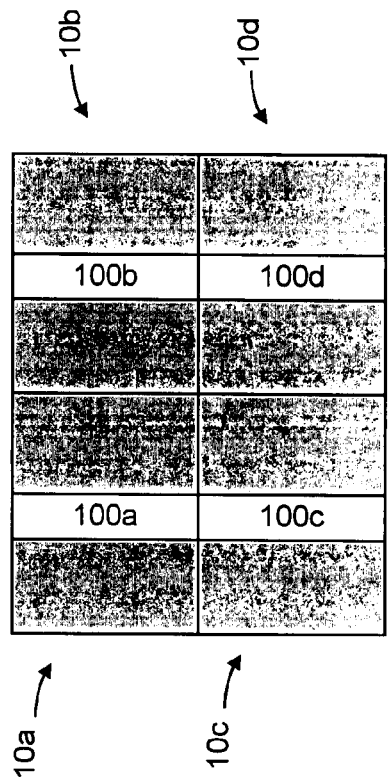

With reference to FIGS. 22A, 22B and 23, the present inventions may be implemented in any configuration and layout of memory cell array 10 and data sense circuitry 100. In this regard, an integrated circuit or memory device may include a plurality of memory cell arrays 10*a-x*, each having corresponding data sense circuitry 100*a-x*. Moreover, as illustrated in FIG. 22A, adjacent arrays 10*a* and 10*b* may share data sense circuitry 100*a*. Alternatively, with reference to FIG. 22B, memory array 10 may include a layout whereby a portion of array 10 is connected to data sense circuitry 100*a* and the remaining portion of array 10 is connected to data sense circuitry 100*b*. Indeed, the integrated circuit or memory device may include a plurality of arrays 10*a*-10*d*, each connected to data sense circuitry 100*a*-100*d*, respectively. The data sense circuitry 100*a*-100*d* may be located or disposed near the center of the associated arrays 10*a*-10*d*, respectively. (See, for example, FIG. 23).

In addition, the memory cells may be arranged, configured and/or controlled using any of the memory cell arrays, architectures and/or control/operation techniques. For example, the memory cells may be arranged, configured and/or controlled using any of the memory cell arrays, architectures and/or control/operation techniques described and illustrated in the following provisional and non-provisional U.S. patent applications:

(1) application Ser. No. 10/450,238, which was filed by Fazan et al. on Jun. 10, 2003 and entitled "Semiconductor Device";

(2) application Ser. No. 10/487,157, which was filed by Fazan et al. on Feb. 18, 2004 and entitled "Semiconductor Device";

(3) application Ser. No. 10/829,877, which was filed by Ferrant et al. on Apr. 22, 2004 and entitled "Semiconductor Memory Cell, Array, Architecture and Device, and Method of Operating Same";

(4) application Ser. No. 10/840,009, which was filed by Ferrant et al. on May 6, 2004 and entitled "Semiconductor Memory Device and Method of Operating Same";

(5) application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same"; and (6) application Ser. No. 60/662,923, which was filed by Carman on Mar. 17, 2005 and entitled "Memory Device/Array Having Electrically Floating Body Memory Cells, and Method of Operating Same".

The entire contents of these six (6) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

Notably, the memory cells may be controlled (for example, programmed or read) using any of the control circuitry described and illustrated in the above-referenced U.S. patent applications. As such, memory cell selection and control circuitry 112 may be implemented as described and illustrated in the above-referenced U.S. patent applications. For the sake of brevity, those discussions will not be repeated; such control circuitry is incorporated herein by reference. Indeed, all such control/selection techniques and circuitry therefor, whether now known or later developed, are intended to fall within the scope of the present inventions.

The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, application Ser. No. 10/884,481 (hereinafter "Integrated Circuit Device Patent Application"). The entire contents of the Integrated Circuit Device Patent Application, including, for example, the inventions, features, attributes, architectures, configurations, materials, techniques and advantages described and illustrated therein, are hereby incorporated by reference herein.

Indeed, memory array 10 (including SOI memory transistors) may be integrated with SOI logic transistors, as described and illustrated in the Integrated Circuit Device Patent Application. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors—not illustrated)). Again, the entire contents of the Integrated Circuit Device Patent Application, including, for example, the inventions, features, attributes, architectures, configurations, materials, techniques and advantages described and illustrated therein, are hereby incorporated by reference.

In addition, the electrically floating memory cells, transistors and/or memory array(s) may be fabricated on, in and/or with strained silicon. For example, fabrication of the floating memory cells, transistors and/or memory array(s) according to the present inventions may employ the techniques described and illustrated in Provisional U.S. Patent Application entitled "One Transistor Memory Cell having Mechanically Strained Electrically Floating Body Region, and Method of Operating Same", which was filed on Oct. 19, 2005, by Bassin, application Ser. No. 60/728,060. The entire contents of application Ser. No. 60/728,060, including, for example, the inventions, features, attributes, architectures, configurations, materials, techniques and advantages described and illustrated therein, are hereby incorporated by reference herein.

Further, the memory arrays may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, application Ser. No. 10/487,157, which was filed by Fazan et al. on Feb. 18, 2004 and entitled "Semiconductor Device"). All such techniques, whether now known or later developed, are intended to fall within the scope of the present inventions.

Notably, the present inventions may be employed or implemented in conjunction with one or more of the inventions, memory arrays and memory devices, and techniques for programming, reading, controlling and/or operating a semiconductor memory cell, array and device of the following provisional U.S. patent applications:

(1) "Bipolar Reading Technique for a Memory Cell Having an Electrically Floating Body Transistor", application Ser. No. 60/638,663, filed Dec. 22, 2004;

(2) "Semiconductor Memory Cell and Method of Operating Same", Application Ser. No. 60/714,917, filed Sep. 7, 2005; and (3) "Semiconductor Memory Cell and Array using Bipolar Transistor Current to Program Same", application Ser. No. 60/722,139, filed Sep. 30, 2005.

The entire contents of these three (3) U.S. provisional patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

As mentioned above, the inventions (and embodiments thereof) described and illustrated herein are entirely applicable to N-channel and/or P-channel transistors. Moreover, while the discussion described and illustrated only source and drain implants, other implants may also be included. For example, implants to modify the operation of memory cells 12, which affect, for example, the power consumption of memory cells 12 as described and illustrated in (1) application Ser. No. 10/450,238, which was filed on Jun. 10, 2003 and entitled "Semiconductor Device", (2) application Ser. No. 10/487,157, which was filed on Feb. 18, 2004 and entitled "Semiconductor Device"; and Provisional application Ser. No. 60/578,631, which was filed on Jun. 10, 2004 and entitled "Asymmetrical Electrically Floating Body Memory Device, and Method of Manufacturing Same".

Further, although reference current generation circuitry 108 is described in the context of supplying a reference current that is substantially equal to one-half of the summation of the currents in a first reference cell, which has a logic low data state, and a second reference cell, which has a logic high data state, other circuitry and techniques may be employed to generate the reference currents used by sense amplifier latch 104 to sense, sample and/or determine the data state of a selected memory cell 12. Indeed, all such reference current generation techniques and circuitry therefor, whether now known or later developed, are intended to be within the scope of the present inventions.

For example, the circuitry and techniques described and illustrated in non-provisional patent application entitled "Reference Current Generator, and Method of Programming, Adjusting and/or Operating Same", filed May 7, 2004 by Portmann et al., and assigned Ser. No. 10/840,902, may be employed to generate an appropriate reference current for data sense amplifier circuitry 102. The entire contents of U.S. patent application Ser. No. 10/840,902, including, for example, the inventions, features, attributes, architectures, configurations, materials, techniques and advantages described and illustrated therein, are hereby incorporated by reference herein.

Figure 24:
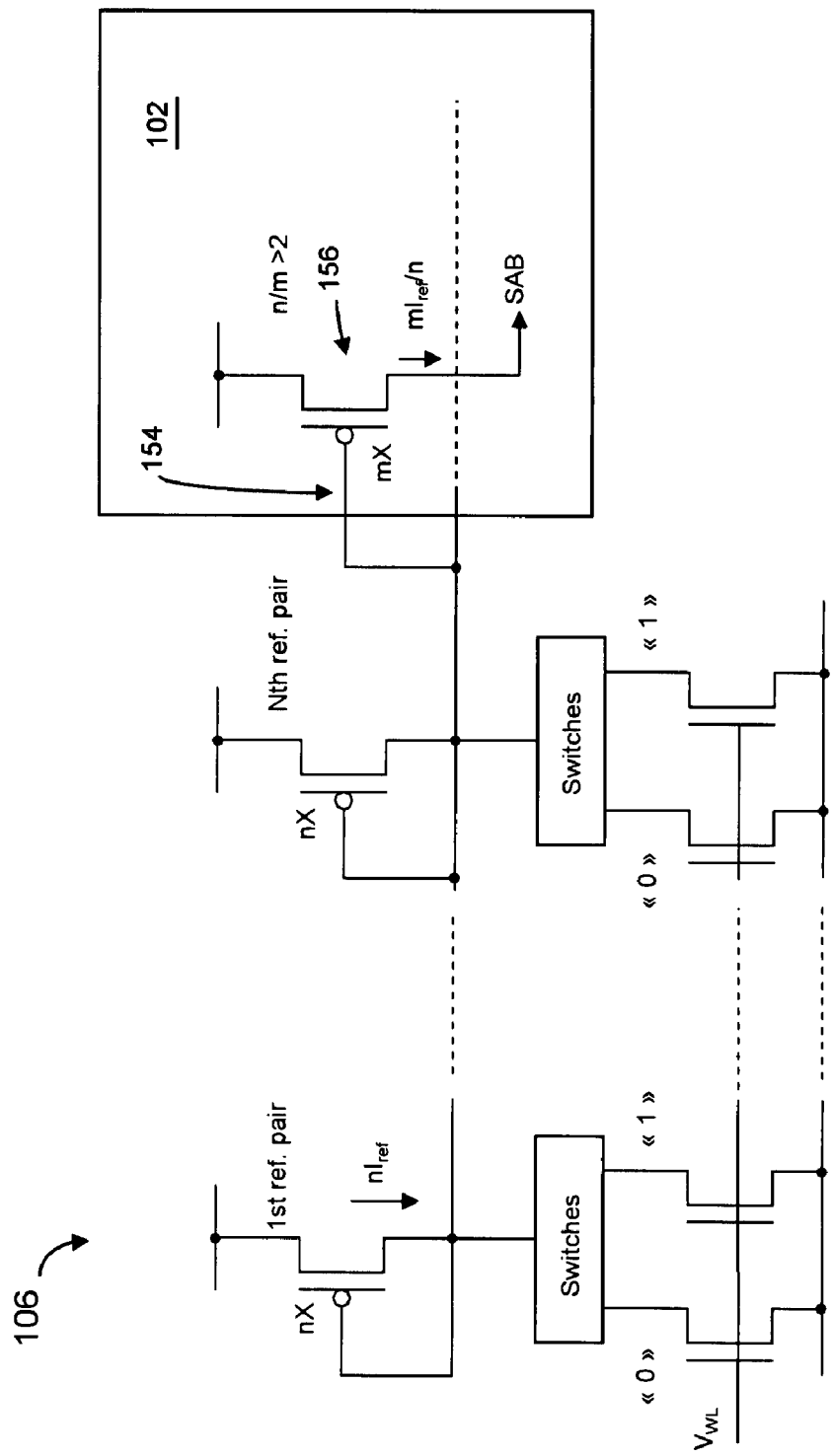
FIG. 24 is a schematic representation of one embodiment of one aspect of the circuitry and techniques for adjusting, setting, determining, controlling and/or generating a reference current, using a MOS transistor "ratioing" configuration, as described and illustrated in U.S. Provisional Patent application Ser. No. 60/718,417, for one aspect of the data sense amplifier circuitry of the present inventions.
Figure 25:
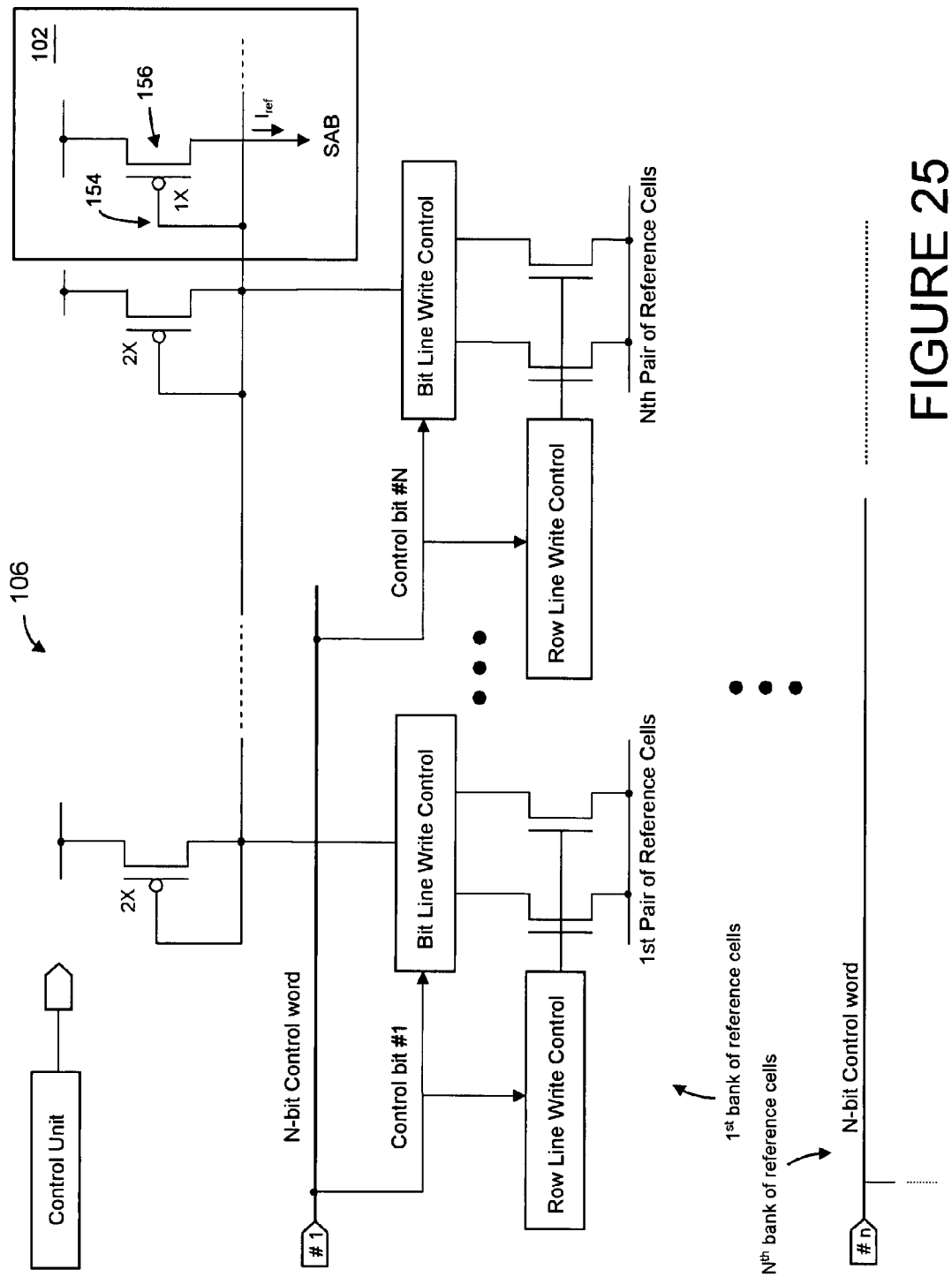
FIG. 25 is a schematic representation of one embodiment of one aspect of the circuitry and techniques for adjusting, setting, determining, controlling and/or generating a reference current, using the state of a control bit to a plurality of pair of reference cells in order to implement a digital control of the reference current level (employed during a read operation), as described and illustrated in U.S. Provisional Patent application Ser. No. 60/718,417, for one aspect of the data sense amplifier circuitry of the present inventions.

In addition, the present inventions may employ the circuitry and techniques for generating a reference current for data sense amplifier circuitry 102 as described and illustrated in U.S. Provisional Patent application Ser. No. 60/718,417, which was filed by Bauser on Sep. 19, 2005, and entitled "Method and Circuitry to Generate a Reference Current for Reading a Memory Cell Having an Electrically Floating Body Transistor, and Device Implementing Same". (See, for example, FIGS. 24 and 25). The entire contents of U.S. Provisional Patent application Ser. No. 60/718,417, including, for example, the inventions, features, attributes, architectures, configurations, materials, techniques and advantages described and illustrated therein, are hereby incorporated by reference herein.

Further, the present inventions may employ the circuitry and techniques for independently controlling certain parameters (for example, temporal or voltage), for a memory operation (for example, restore, write, refresh), to program or write a predetermined data state into a memory cell (for example, programming or writing data state "1" or "0" into a memory cell) as described and illustrated in U.S. Provisional Patent application Ser. No. 60/731,668, which was filed by Popoff on Oct. 31, 2005, and entitled "Method and Apparatus for Varying the Programming Duration of a Floating Body Transistor, and Memory Cell, Array, and/or Device Implementing Same". For example, the duration of programming/writing of a given memory state into a memory cell by data sense amplifier circuitry 102 may be controlled adjusted, determined and/or predetermined according to or based on the given memory operation (for example, restore, write, refresh). Likewise, the voltage conditions applied to the memory cell for programming/writing a given memory state into a memory cell by data sense amplifier circuitry 102 may be controlled and/or adjusted according to the memory operation (for example, restore, write, refresh). The entire contents of U.S. Provisional Patent application Ser. No. 60/731,668, including, for example, the inventions, features, attributes, architectures, configurations, materials, techniques and advantages described and illustrated therein, are hereby incorporated by reference herein.

The illustrated/exemplary voltage levels applied to the electrically floating body memory cells which implement the read and write operations are merely exemplary. The indicated voltage levels may be relative or absolute. Alternatively, the voltages indicated may be relative in that each voltage level, for example, may be increased or decreased by a given voltage amount (for example, each voltage may be increased by 0.5 volts) whether one or more of the voltages (for example, the source, drain or gate voltages) become or are positive and negative.

Figure 26:
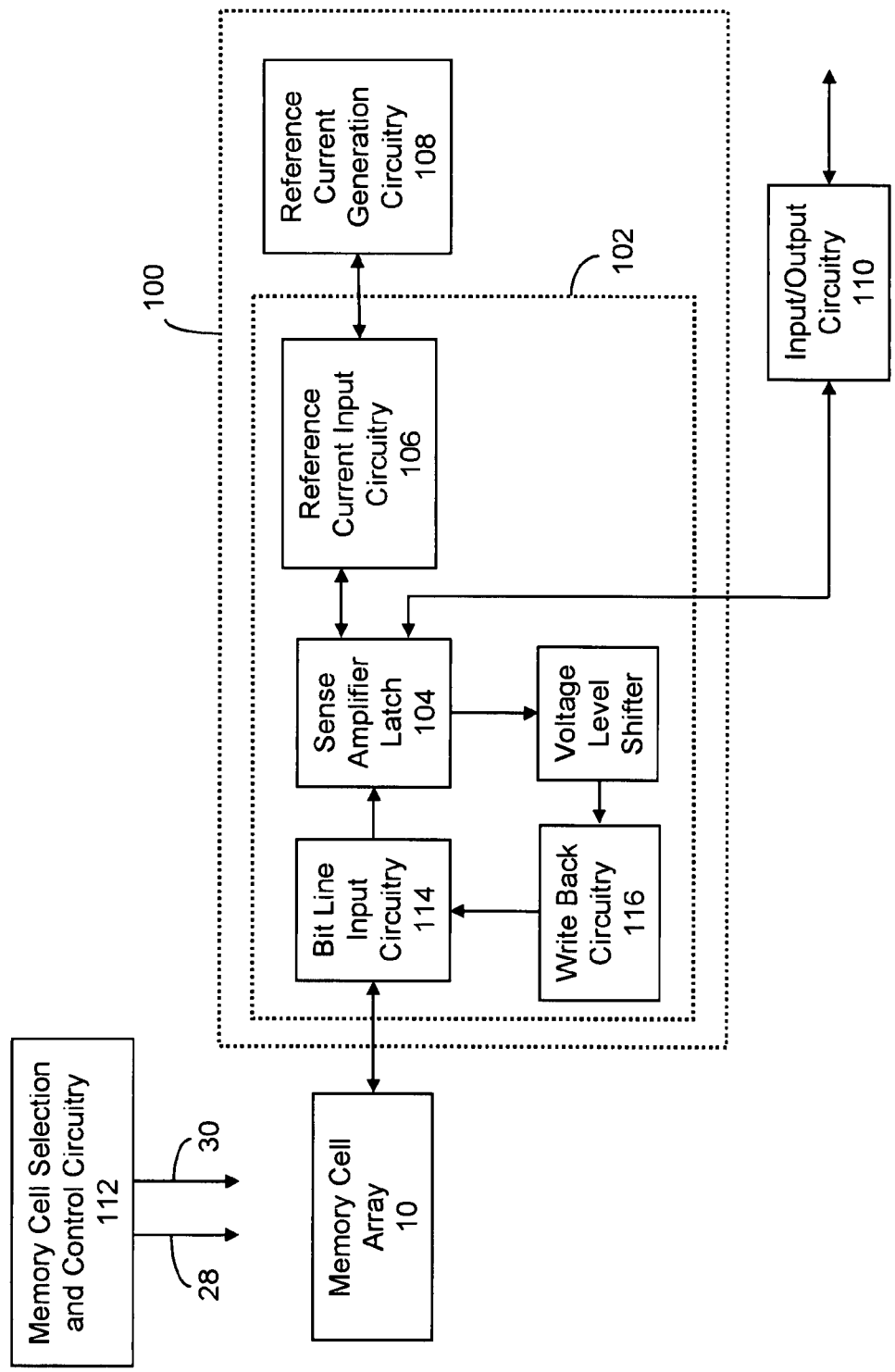
FIG. 26 is a schematic block diagram of an embodiment of the data sense and write circuitry, having a voltage level shifter incorporated in the write-back circuitry path, in conjunction with a memory cell array and input/output circuitry, according certain aspects of the present inventions.

Notably, the present inventions may be implemented in conjunction with a voltage level shifter in the write-back circuitry path. (See, FIG. 26). In this way, the voltage levels applied to the memory cells may be different than the voltage levels pertaining to the sense amplifier latch 104. All voltage level shifting techniques and circuitry therefor, whether now known or later developed, are intended to be within the scope of the present inventions.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

What is claimed is:

1. An integrated circuit device comprising:
   a bit line having a plurality of memory cells coupled thereto wherein each memory cell includes an electrically floating body transistor comprising:
      a source region;
      a drain region;
      a body region disposed between the source region and the drain region,
   wherein the body region is electrically floating; and
      a gate disposed over the body region; and
   wherein each memory cell includes a plurality of data states including a first data state which corresponds to a first charge in the body region of the transistor and a second data state which corresponds to a second charge in the body region of the transistor;
   data sense circuitry, coupled to the bit line, the data sense circuitry including:
      a sense amplifier having a plurality of inputs including:
         a first input, having a capacitance, to receive a signal, wherein the sense amplifier includes at least one transistor coupled to the bit line to receive the signal on the first input wherein the signal is representative of a data state of a selected memory cell, and wherein the selected memory cell is one of the plurality of memory cells which are coupled to the bit line; and
         a second input to receive a reference signal;
      circuitry, coupled to the bit line, to (a) write the data state of the selected memory cell or (b) write (i) the data state back into the selected memory cell or (ii) a different data state into the selected memory cell; and
   wherein, in operation, the sense amplifier determines the data state of the selected memory cell based on (i) a first voltage developed on the first input wherein the first voltage corresponds to the signal representative of a data state of a selected memory cell and (ii) a second voltage provided to the second input wherein the second voltage corresponds to the reference signal.

2. The integrated circuit device of claim 1 wherein the gate of the first transistor of the sense amplifier is connected to the first input.

3. The integrated circuit device of claim 2 wherein the sense amplifier is a cross-coupled type sense amplifier.

4. The integrated circuit device of claim 1 further including a current mirror circuit coupled between the bit line and the first input.

5. The integrated circuit device of claim 1 further including reference current generation circuitry, coupled to the second input, to generate the reference signal.

6. The integrated circuit device of claim 5 further including a current mirror circuit which is coupled between the second input and the reference current generation circuitry.

7. The integrated circuit device of claim 1 wherein the sense amplifier determines the data state of the selected memory cell based on the voltage developed on the first input provided by:
   charging or discharging the capacitance of the first input by a current which is representative of the data state of the selected memory cell.

8. The integrated circuit device of claim 1 further including voltage level shifter circuitry coupled between the circuitry and the sense amplifier.

9. An integrated circuit device comprising:
   a bit line having a plurality of memory cells coupled thereto wherein each memorycell includes an electrically floating body transistor comprising:
      a source region;
      a drain region;
      a body region disposed between the source region and the drain region,
   wherein the body region is electrically floating; and
      a gate disposed over the body region; and
   wherein each memory cell includes a plurality of data states including a first data state representative of a first charge In the body region of the transistor and a second data state representative of a second charge in the body region of the transistor;
   data sense circuitry, coupled to the bit line, the data sense circuitry including a sense amplifier which includes a plurality of inputs including:
      a first input, having a capacitance, to receive a signal, wherein the sense amplifier includes at least one transistor coupled to the bit line to receive the signal on the first input wherein the signal is representative of a data state of a selected memory cell, and wherein the selected memory cell is one of the plurality of memory cells which are coupled to the bit line;
      a second input to receive a reference signal; and
      a pitch that is substantially the same as a pitch of the bit line; and
   wherein, in operation, the sense amplifier determines the data state of the selected memory cell based on: (i) a first voltage developed on the first input wherein the first voltage corresponds to the signal representative of a data state of a selected memory cell and (ii) a second voltage provided to the second input wherein the second voltage corresponds to the reference signal.

10. The integrated circuit device of claim 9 wherein the gate of the first transistor of the sense amplifier is connected to the first input.

11. The integrated circuit device of claim 9 wherein the sense amplifier is a cross-coupled type sense amplifier.

12. The integrated circuit device of claim 9 further including a current mirror circuit coupled between the bit line and the first input.

13. The integrated circuit device of claim 9 further including reference current generation circuitry, coupled to the second input node, to generate the reference signal.

14. The integrated circuit device of claim 13 further including a current mirror circuit which is coupled between the second input and the reference current generation circuitry.

15. The integrated circuit device of claim 9 wherein the sense amplifier determines the data state of the selected memory cell based on the voltage developed on the first input node provided by:

charging or discharging the capacitance of the first input by a current which is representative of the data state of the selected memory cell.

16. An integrated circuit device comprising:
a bit line having a plurality of memory cells coupled thereto wherein each memory cell includes an electrically floating body transistor including:
   a source region;
   a drain region;
   a body region disposed between the source region and the drain region, wherein the body region is electrically floating; and
   a gate disposed over the body region; and
   wherein each memory cell includes a plurality of data states including a first data state representative of a first charge in the body region of the transistor and a second data state representative of a second charge in the body region of the transistor;
a sense amplifier including first and second input nodes, each input node having an intrinsic capacitance, wherein the sense amplifier further includes:
   a first transistor having first and second regions and a gate, wherein the first region is connected to or forms a part of the first input node, and wherein the first input node is coupled to the bit line to receive a current which is representative of a data state of a selected memory cell, wherein the selected memory cell is one of the plurality of memory cells which are coupled to the bit line; and
   a second transistor having first and second regions and a gate, wherein the first region of the second transistor is connected to or forms a part of the second input node, and wherein the second input node receives a reference current; and
reference current generation circuitry, coupled to the second input node of the sense amplifier, to generate a current that is representative of the reference current;
first current mirror circuit having an input which is coupled to the reference generation circuitry and an output which is coupled to the second input node; and
wherein, in operation, the sense amplifier determines the data state of the selected memory cell based on voltages developed on the first and second input nodes.

17. The integrated circuit device of claim 16 wherein:
the gate of the first transistor of the sense amplifier is connected to the second input node and the gate of the second transistor of the sense amplifier is connected to the first input node;
the second region of the first transistor of the sense amplifier is connected to a first reference voltage and the second region of the second transistor of the sense amplifier is connected to the first reference voltage; and
wherein the sense amplifier further includes third and fourth transistors, each having first and second regions and a gate, wherein:
the first regions of the third and fourth transistors are connected and coupled to a second reference voltage;
the second region of the third transistor is connected to or forms a part of the first input node;
the second region of the fourth transistor is connected to or forms a part of the second input node;
the gate of the third transistor is connected to the second input node; and
the gate of the fourth transistor is connected to the first input node.

18. The integrated circuit device of claim 16 further including:
write back circuitry, coupled to the sense amplifier, to restore the data state of the selected memory cell or write a new data state into the selected memory cell; and
voltage level shifter circuitry coupled between the write back circuitry and the sense amplifier.

19. The integrated circuit device of claim 16 further including write back circuitry, coupled to the sense amplifier, to restore the data state of the selected memory cell or write a new data state into the selected memory cell.

20. The integrated circuit device of claim 16 wherein the sense amplifier determines the data state of the selected memory cell based on voltages developed on the first and second input nodes provided by:
charging or discharging the intrinsic capacitance of the first input node by the current which is representative of the data state of the selected memory cell; and
charging or discharging the intrinsic capacitance of the second input node by the reference current.

21. The integrated circuit device of claim 16 wherein the sense amplifier includes a pitch that is substantially the same as a pitch of the bit line.

22. The integrated circuit device of claim 16 further including a second current mirror circuit having an input which is coupled to the bit line and an output which is coupled to the first input node.

23. The integrated circuit device of claim 16 further including write back circuitry, coupled to the first input node of the sense amplifier, to restore the data state of the selected memory cell or write a new date state into the selected memory cell.

24. The integrated circuit device of claim 16 further including voltage level shifter circuitry coupled between the bit line and the sense amplifier.

25. The integrated circuit device of claim 16 wherein the sense amplifier determines the data state of the selected memory cell based, at least in part, on voltages developed on the first and second input nodes provided by charging or discharging the capacitance of the first input node by the current which is representative of the data state of the selected memory cell.

* * * * *